United States Patent
Diep et al.

(10) Patent No.: US 9,442,838 B2
(45) Date of Patent: Sep. 13, 2016

(54) REMAPPING MEMORY CELLS BASED ON FUTURE ENDURANCE MEASUREMENTS

(71) Applicant: Rambus Inc., Sunnyvale, CA (US)

(72) Inventors: Trung Diep, San Jose, CA (US); John Eric Linstadt, Palo Alto, CA (US); J. James Tringali, Los Altos, CA (US); Hongzhong Zheng, Sunnyvale, CA (US); Brent Steven Haukness, Monte Sereno, CA (US)

(73) Assignee: RAMBUS INC., Sunnyvale, GA (US)

( * ) Notice: Subject to any disclaimer, the term of this patent is extended or adjusted under 35 U.S.C. 154(b) by 204 days.

(21) Appl. No.: 14/058,081

(22) Filed: Oct. 18, 2013

(65) Prior Publication Data

US 2014/0115296 A1     Apr. 24, 2014

Related U.S. Application Data

(60) Provisional application No. 61/716,990, filed on Oct. 22, 2012.

(51) Int. Cl.
| | | |
|---|---|---|
| *G11C 13/00* | (2006.01) | |
| *G06F 12/02* | (2006.01) | |
| *G11C 29/50* | (2006.01) | |
| G11C 29/04 | (2006.01) | |

(52) U.S. Cl.
CPC ....... *G06F 12/0238* (2013.01); *G11C 13/0028* (2013.01); *G11C 13/0035* (2013.01); *G11C 13/0069* (2013.01); *G11C 29/50008* (2013.01); *G06F 2212/7204* (2013.01); *G06F 2212/7211* (2013.01); *G11C 2029/0409* (2013.01); *G11C 2213/72* (2013.01); *G11C 2213/79* (2013.01)

(58) Field of Classification Search
CPC .............. G06F 2212/7211; G06F 2212/1036; G06F 2212/7204; G11C 13/0002; G11C 16/349
See application file for complete search history.

(56) References Cited

U.S. PATENT DOCUMENTS

| | | | | |
|---|---|---|---|---|
| 8,601,202 | B1* | 12/2013 | Melcher et al. | 711/103 |
| 2006/0262599 | A1* | 11/2006 | Wu | G11C 16/0416 365/185.05 |
| 2008/0198674 | A1 | 8/2008 | Keller | |
| 2009/0094409 | A1* | 4/2009 | Yeh et al. | 711/103 |
| 2009/0172253 | A1 | 7/2009 | Rothman et al. | |
| 2009/0172255 | A1* | 7/2009 | Yeh et al. | 711/103 |
| 2009/0193221 | A1 | 7/2009 | Reid | |
| 2009/0204852 | A1 | 8/2009 | Diggs et al. | |
| 2009/0248962 | A1 | 10/2009 | Kim et al. | |
| 2010/0023675 | A1* | 1/2010 | Chen et al. | 711/103 |
| 2010/0064094 | A1* | 3/2010 | Yeh | 711/103 |
| 2010/0180069 | A1* | 7/2010 | Yeh | 711/103 |
| 2010/0244023 | A1* | 9/2010 | Parkinnson | 257/48 |
| 2011/0235403 | A1* | 9/2011 | Kang | G11C 13/0004 365/148 |
| 2012/0017052 | A1* | 1/2012 | Sauber | G06F 12/0246 711/154 |
| 2014/0063902 | A1* | 3/2014 | Sunkavalli et al. | 365/148 |
| 2014/0089560 | A1* | 3/2014 | Sunkavalli et al. | 711/103 |

\* cited by examiner

*Primary Examiner* — Ryan Bertram

(74) *Attorney, Agent, or Firm* — Morgan, Lewis & Bockius LLP

(57) ABSTRACT

A method of operating a memory device that includes groups of memory cells is presented. The groups include a first group of memory cells. Each one of the groups has a respective physical address and is initially associated with a respective logical address. The device also includes an additional group of memory cells that has a physical address but is not initially associated with a logical address. In the method, a difference in the future endurance between the first group of memory cells and the additional group of memory cells is identified. When the difference in the future endurance between the first group and the additional group exceeds a predetermined threshold difference, the association between the first group and the logical address initially associated with the first group is ended and the additional group is associated with the logical address that was initially associated with the first group.

21 Claims, 19 Drawing Sheets

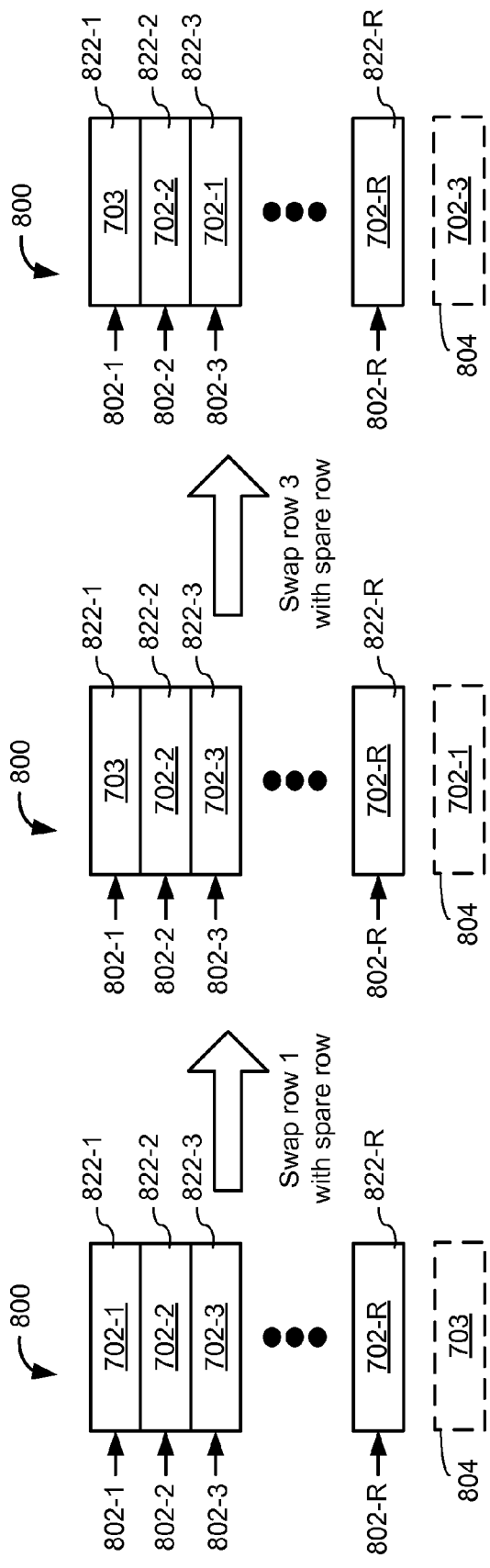

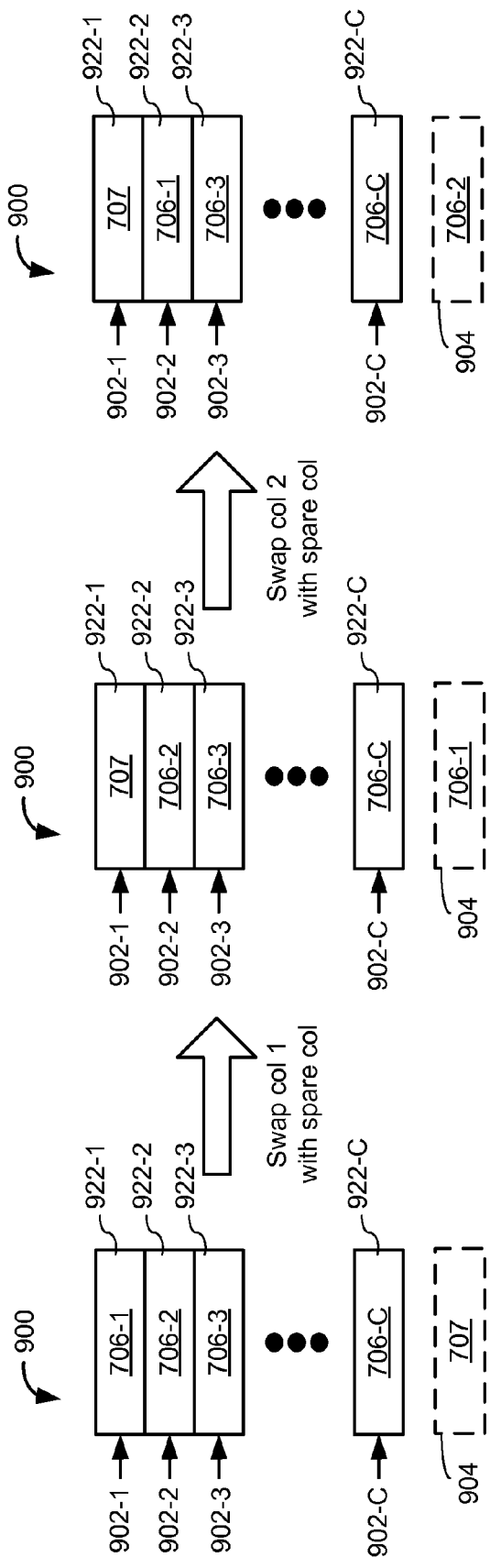

REMAPPING MEMORY CELLS BASED ON FUTURE ENDURANCE MEASUREMENTS

RELATED APPLICATION

This application claims priority to U.S. Provisional Application Ser. No. 61/716,990, filed Oct. 22, 2012, which is incorporated herein by reference in its entirety.

BACKGROUND

Ensuring the long-term reliability of resistive change memory devices presents significant engineering challenges. For example, the resistance of a high-resistance state for a resistive change memory cell may decrease over time as the resistive change memory cell is repeatedly programmed. This decrease causes the resistive change memory cell, and thus of the resistive change memory device that includes the resistive change memory cell, to have what is referred to herein as write endurance. The term "write endurance" means the number of set/reset cycles a resistive change memory cell undergo before the reset resistance and the set resistance of the resistive change memory cell cannot be distinguished rapidly and reliably. In addition, a limited number of resistive change memory cells in a device may be programmed disproportionately, causing those resistive change memory cells to wear out more quickly than other resistive change memory cells in the device. Accordingly, there is a need for techniques to detect, characterize, and mitigate degradation of resistive change memory devices.

BRIEF DESCRIPTION OF THE DRAWINGS

FIGS. 8A-8C illustrate a row translation table in accordance with some embodiments.

FIGS. 9A-9C illustrate a column translation table in accordance with some embodiments.

Like reference numerals refer to corresponding parts throughout the drawings.

DESCRIPTION OF EMBODIMENTS

Figure 1:
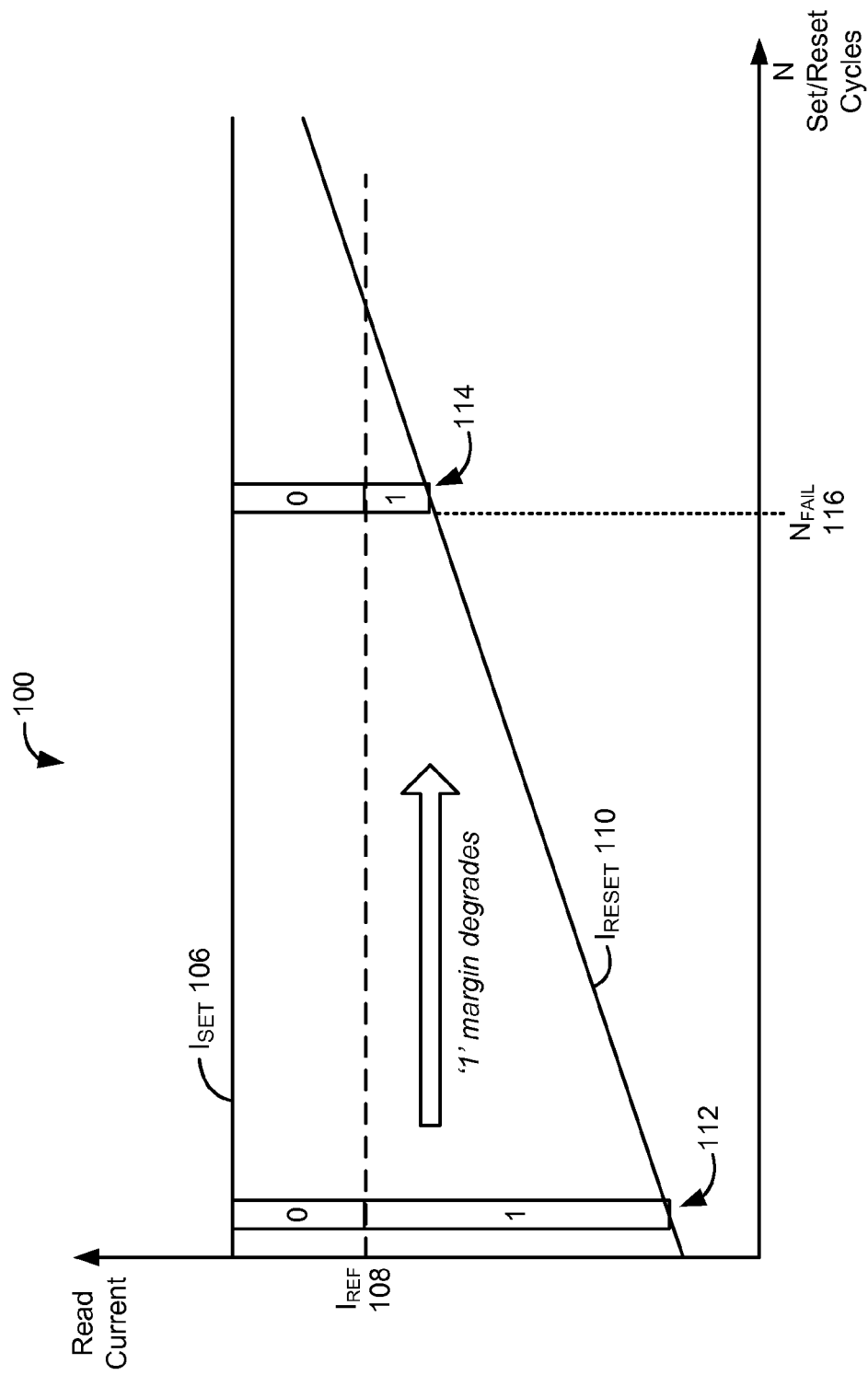
FIG. 1 is a prophetic example of a graph of read current versus the number of set/reset cycles that have been performed on a resistive change memory cell in a resistive change memory device in accordance with some embodiments.

In some embodiments, a method of operating a memory device is performed for a device that includes groups of memory cells. The groups include a first group of memory cells. Each one of the groups has a respective physical address and is initially associated with a respective logical address. The device also includes an additional group of memory cells that has a physical address but is not initially associated with a logical address. In the method, a difference in the future endurance between the first group of memory cells and the additional group of memory cells is identified. When the difference in the future endurance between the first group and the additional group exceeds a predetermined threshold difference, the association between the first group and the logical address initially associated with the first group is ended and the additional group is associated with the logical address that was initially associated with the first group.

In some embodiments, a memory device includes groups of memory cells, including an unused group. Each group has a respective physical address. The device also includes a future endurance comparator to compare the future endurances of the unused group and a specified group distinct from the unused group, and a translation table to map respective logical addresses to the physical addresses of respective groups. The translation table does not map any logical address to the physical address of the unused group. The translation table is programmable to replace the specified group with the unused group and to designate the specified group as unused, in response to detection by the future endurance comparator of a difference in the future endurance between the unused group and the specified group that exceeds a predetermined threshold difference.

Note that although the embodiments described herein refer to a resistive change memory device, the embodiments described herein may be applied to any type of memory device in which the endurance of memory cells change over time (e.g., the endurance of the memory cells decrease or otherwise degrade over time or with use, etc.).

Reference will now be made in detail to various embodiments, examples of which are illustrated in the accompanying drawings. In the following detailed description, numerous specific details are set forth in order to provide a thorough understanding of the disclosed embodiments. However, embodiments may be practiced without these specific details. In other instances, well-known methods, procedures, components, and circuits have not been described in detail so as not to unnecessarily obscure aspects of the embodiments.

A resistive change memory device includes an array of resistive change memory cells, each of which includes a resistive memory element. The resistive memory element includes a resistance-switching material situated between two electrodes. The resistance-switching material has at least two states, a high-resistance state and a low-resistance state, and can be cycled between these two states by application of appropriate voltages to the electrodes, thus allowing the resistive memory element to be programmed. For example, a resistive change memory cell for which the resistance-switching material has been programmed to the high-resistance state (referred to herein as a "reset" state) is considered to store a "1" and a resistive change memory cell for which the resistance-switching material has been programmed to the low-resistance state (referred to herein as a "set" state) is considered to store a "0," or vice-versa.

Four general classes of resistance-switching materials are solid electrolyte materials, insulating materials, phase-change materials, and organic materials. The term "resistive change memory device" as used herein includes, without limitation, memories that use any of these classes of resistance-switching materials (e.g., resistance-switching random access memories (RRAMs), conductive-bridging random access memories (CB-RAMs), and phase-change memories (PRAMs)). Examples of resistance-switching electrolyte materials include $Ge_xSe_{1-x}$, $Ge_xS_{1-x}$, $Cu_2S$, $CuO$, $Ag_2S$, $WO_3$, $CeO$, $HfO_2$, and $SiO_2$. Examples of resistance-switching insulating materials include $TiO_2$, $NiO$, $SrZrO_3$, $SrTiO_3$, $ZrO_2$, Cr doped $MoO_x$, and $MgO$.

A resistive change memory cell using a solid electrolyte material as the resistance-switching material is typically fabricated using a metal that exhibits ionic conductivity in the solid electrolyte (i.e., a metal ion source for the solid electrolyte) as the first electrode and an inert metal as the second electrode. Application of a biasing condition (e.g., a first bias voltage applied for a specified duration) that corresponds to a set operation causes the first electrode to inject ions into the solid electrolyte; the ions precipitate into filaments that produce low-resistance paths between the electrodes, resulting in formation of a low-resistance state (or set state) in the solid electrolyte. Application of a biasing condition (e.g., a second bias voltage distinct from the first bias voltage, applied for a specified duration) that corresponds to a reset operation causes the dissolution of the filaments, resulting in formation of a high-resistance state (or reset state) in the solid electrolyte. While other types of resistance-switching materials may operate in accordance with other physical mechanisms, the materials also may be programmed to low-resistance (set) and high-resistance (reset) states. The reset operation, however, does not entirely reverse the set operation: some ions injected into the solid electrolyte during the set operation remain in the solid electrolyte after the reset operation. Over time, these ions accumulate in the solid electrolyte as the resistive change memory cell is repeatedly cycled between set and reset states, resulting in a decrease in the resistive change memory cell's reset resistance (i.e., the resistance in the reset state). Similarly, ions may also accumulate in the form of reduced metal at the inert electrode leading to a reduction in the effective thickness of the electrolyte and reducing the resistive change memory cell's resistance in the high resistance state. Eventually the reset resistance and the set resistance of the resistive change memory cell change to a point at which the reset resistance and the set resistance cannot be distinguished rapidly and reliably. When this occurs, the resistive change memory cell can be regarded as no longer being functional.

A newly-fabricated resistive change memory cell has write endurance greater than a specified write endurance. The specified write endurance is the minimum number of set/reset cycles the memory cell will undergo before the above-described degradation mechanisms make the reset resistance and the set resistance of the resistive change memory cell difficult to distinguish rapidly and reliably. Each set/reset cycle that the memory cell undergoes degrades the difference between the reset resistance and the set resistance. Thus, at any point in its lifetime, a resistive change memory cell can be regarded as having what will be referred to as future endurance. The future endurance of a resistive memory cell represents the number of set/reset cycles the memory cell will be able to undergo before the memory cell ceases to be functional.

FIG. 1 shows a prophetic example of a graph 100 of read current versus the number N of set/reset cycles that have been performed on a resistive change memory cell in a resistive change memory device in accordance with some embodiments. Read current $I_{SET}$ 106 is the read current for the resistive change memory cell in a set state and read current $I_{RESET}$ 110 is the read current for the resistive change memory cell in a reset state. Read current $I_{SET}$ 106 is greater than read current $I_{RESET}$ 110 because the resistive change memory cell's resistance in the set state is less than the resistive change memory cell's resistance in the reset state. In some embodiments, a read operation for the resistive change memory cell is performed by comparing the resistive change memory cell's read current to a reference current $I_{REF}$ 108. In the example of FIG. 1, the resistive change memory cell is assumed to store a "1" in the reset state and a "0" in the set state. Thus, if the resistive change memory cell's read current is found to be less than $I_{REF}$ 108, a determination is made that the resistive change memory cell stores a "1," and if the resistive change memory cell's read current is found to be greater than $I_{REF}$ 108, a determination is made that the resistive change memory cell stores a "0." Read current $I_{RESET}$ 110 increases as the number of set/reset cycles increases, indicating that the resistive change memory cell's reset resistance is decreasing with increasing numbers of set/recycles. At a first point 112, read current $I_{RESET}$ has sufficient margin with respect to reference current $I_{REF}$ 108 to allow a "1" stored in the resistive change memory cell to be read rapidly and reliably. At a second point 114, however, the reset resistance has decreased by an amount such that read current $I_{RESET}$ no longer has sufficient margin with respect to reference current $I_{REF}$ 108 to allow a "1" stored in the resistive change memory cell to be read rapidly and reliably. The number of cycles ($N_{FAIL}$) 116 corresponding to the second point 114 represents the write endurance of the resistive change memory cell: the resistive change memory cell is deemed to have failed when the number of set/reset cycles 104 exceeds $N_{FAIL}$ 116. Note that although read current $I_{RESET}$ 110 is illustrated as being a linear function of the number N of set/reset cycles, in general read current $I_{RESET}$ 110 (and hence, the resistive change memory cell's resistance) is a monotonic function (and in some implementations a non-linear monotonic function) of the number N of set/reset cycles.

Resistive change memory cells with endurance such as that illustrated in FIG. 1 include three-terminal resistive change memory cells and two-terminal resistive change memory cells. FIGS. 2A and 2B are schematic diagrams of respective three-terminal resistive change memory cells 200 (FIG. 2A) and 220 (FIG. 2B) in accordance with some embodiments. In resistive change memory cells 200 and 220, a pass gate 208 (e.g., a transistor 208) and a resistive memory element 210 are arranged in series between a node (or terminal) 202 and a node (or terminal) 206. Node 202 connects to a bit line (e.g., bit line BL0, BL1, BL2, BL3, BL4, or BL5, FIGS. 3A-3B) and node 206 connects to a source line (e.g., source line SL0, SL1, or SL2, FIGS. 3A-3B). The gate of pass gate 208 connects to a node (or terminal) 204 that connects to a word line (e.g., word line WL0, WL1 or WL2, FIGS. 3A-3B). The order of pass gate 208 and resistive memory element 210 is reversed in resistive change memory cell 220 as compared to resistive change memory cell 200: in resistive change memory cell 200 the pass gate 208 connects directly to node 202 and resistive memory element 210 connects directly to node 206, while in resistive change memory cell 220 the resistive memory element 210 connects directly to node 202 and pass gate 208 connects directly to node 206.

To program resistive change memory cells 200 and 220, a logic-high ("H") signal is applied to the gate of pass gate 208 via node 204 to turn on pass gate 208, and a programming voltage is applied between nodes 202 and 206 for a specified duration. In some embodiments, a positive set voltage $V_{SET}$ is applied between nodes 202 and 206 (e.g., $V_{SET}$ is a positive voltage relative to node 206) for a first duration to perform a set operation and a negative reset voltage $-V_{RESET}$ is applied between nodes 202 and 206 (e.g., $-V_{RESET}$ is a negative voltage relative to node 206) for a second duration to perform a reset operation. Note that the first duration and the second duration are typically equal. Also note that this specification refers to a logic-high ("H") signal being applied to a gate to turn on pass gate 208. However, a voltage other than the logic-high ("H") signal and that is sufficient to turn on the pass gate may be applied to the pass gate. Similarly, this specification refers to a logic-low ("L") signal being applied to pass gate 208 to turn off the pass gate. However, a voltage other than the logic-low ("L") signal and that is sufficient to turn off the pass gate may be applied to the pass gate.

Figure 2D:
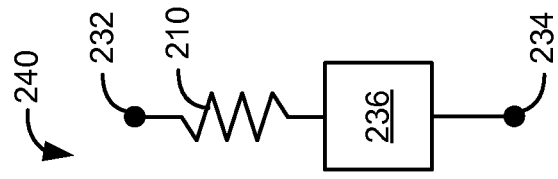
FIGS. 2A-2D are schematic diagrams of resistive change memory cells in accordance with some embodiments.
Figure 2C:
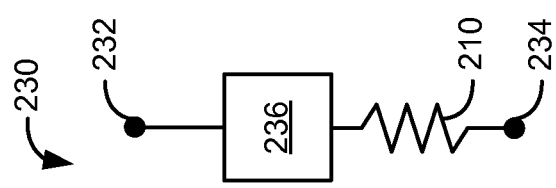
Figure 2B:
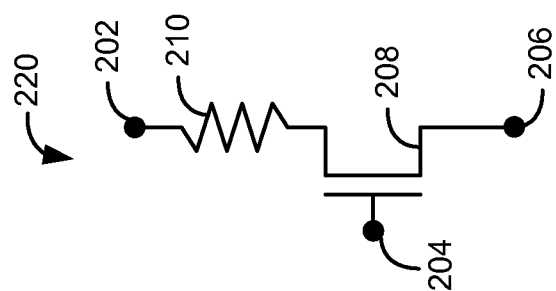
Figure 2A:
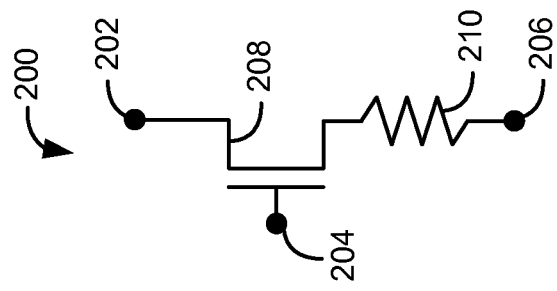
Figure 3A:
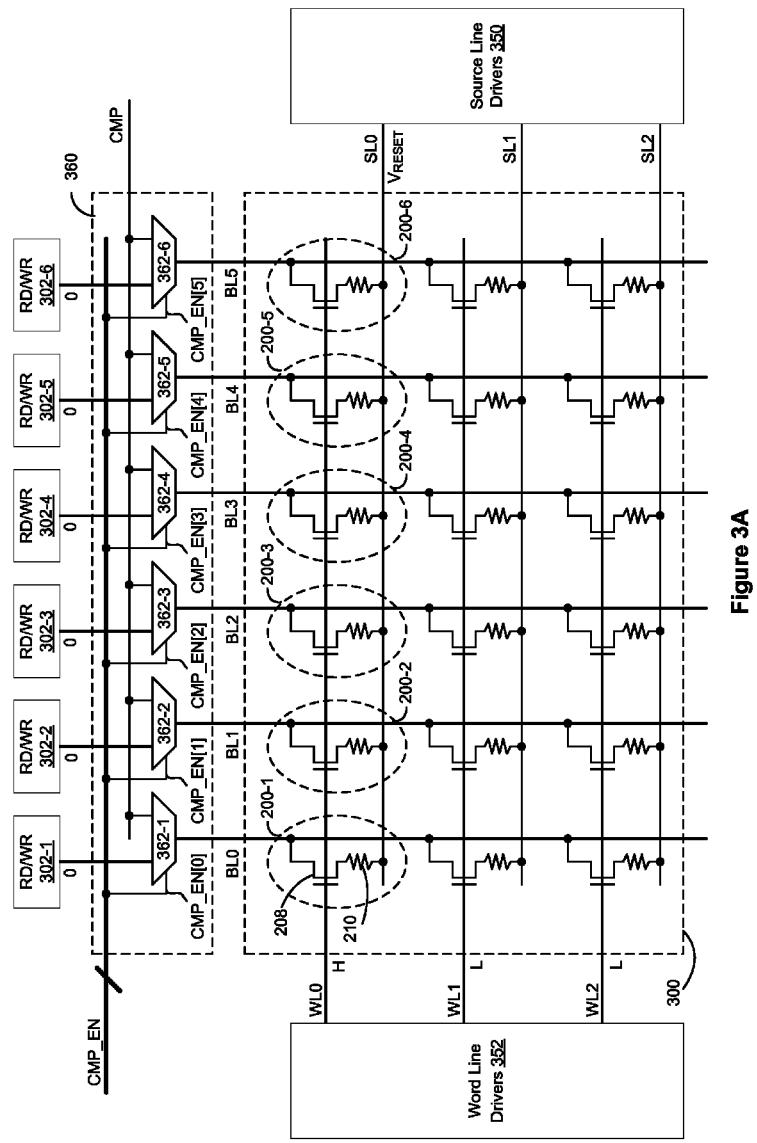
FIGS. 3A-3D are schematic diagrams of arrays of resistive change memory cells along with circuitry to produce one or more currents, each corresponding to the future endurance of a respective group of memory cells, in accordance with some embodiments.
Figure 3B:
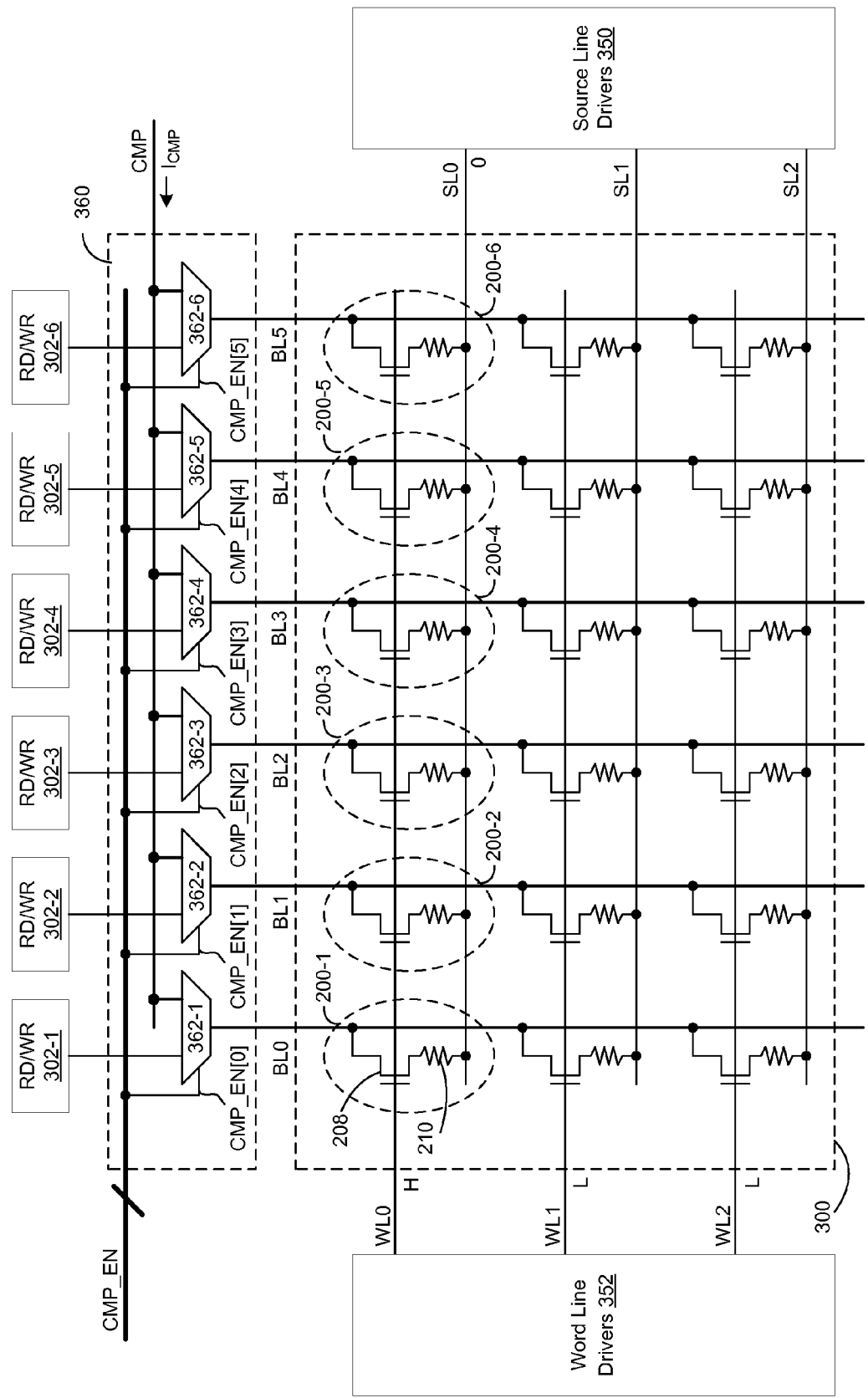

FIGS. 2C and 2D are schematic diagrams of respective two-terminal resistive change memory cells 230 (FIG. 2C) and 240 (FIG. 2D). In resistive change memory cells 230 and 240, the resistive memory element 210 is arranged in series with a nonlinear conductive element 236 between a node 232 and a node 234. Node 232 connects to a bit line (e.g., bit line BL0, BL1, BL2, BL3, BL4, or BL5, FIGS. 3A-3B) and node 234 connects to a conductive line distinct from the bit line (e.g., source lines S0, S1 or S2, FIGS. 3A-3B). Note that for two-terminal resistive change memory cells, the conductive lines (e.g., source lines SL0, SL1, or SL2, FIGS. 3A-3B) are analogous to the word lines (e.g., word lines WL0, WL1, WL2, FIGS. 3A-3B) in three-terminal resistive change memory cells in that the conductive lines are used to select a particular row of the array of resistive change memory cells. Accordingly, the word lines WL0, WL1, and WL2 of FIGS. 3A-3B are not present when the array of resistive change memory cells includes two-terminal resistive change memory cells. Nonlinear conductive element 236 has a non-linear current-voltage characteristic that reduces parasitic leakage currents in arrays of resistive change memory cells 230 or 240 (e.g., in array 300, FIGS. 3A-3B). In some embodiments, nonlinear conductive element 236 conducts (either unidirectionally or bidirectionally) only when a voltage across the nonlinear conductive element 236 exceeds a threshold voltage $V_{TH}$ (e.g., a diode drop). In some embodiments, the nonlinear conductive element 236 is implemented as a diode. In some other embodiments, the nonlinear conductive element 236 is implemented as two diodes arranged in parallel but with opposite orientations, to provide bidirectional conductivity. The order of the resistive memory element 210 and nonlinear conductive element 236 is reversed in resistive change memory cell 240 as compared to resistive change memory cell 230: in resistive change memory cell 230 the nonlinear conductive element 236 connects directly to node 232 and resistive memory element 210 connects directly to node 234, while in resistive change memory cell 240 the resistive memory element 210 connects directly to node 232 and nonlinear conductive element 236 connects directly to node 234.

The two-terminal resistive change memory cells 230 and 240 are programmed in a similar manner to the three-terminal resistive change memory cells 200 and 220, except that there is no pass gate to turn on and the programming voltages are adjusted to account for threshold voltage $V_{TH}$. For example, instead of applying a voltage $V_{SET}$ or a voltage $-V_{RESET}$, respectively, a voltage $(V_{SET}+V_{TH})$ or a voltage $-(V_{RESET}+V_{TH})$ is applied between nodes 232 and 234.

Resistive change memory cells such as resistive change memory cells 200, 220, 230, or 240 are situated in an array in a resistive change memory device. FIG. 3A illustrates an array 300 of resistive change memory cells 200 (FIG. 2A), including resistive change memory cells 200-1, 200-2, 200-3, 200-4, 200-5, and 200-6, in accordance with some embodiments. While array 300 is made up of resistive change memory cells 200, it alternatively could be made up of resistive change memory cells 220 (FIG. 2B) or modified as described above with reference to FIGS. 2C and 2D to include resistive change memory cells 230 (FIG. 2C) and 240 (FIG. 2D). Word lines WL0, WL1, and WL2 extend across respective rows of resistive change memory cells 200 in array 300; each of the word lines WL0, WL1 and WL2 is coupled to the gates of the pass gates 208 of the resistive change memory cells 200 in a respective row. Each of the word lines WL0, WL1, and WL2 is also coupled to a respective one of the word line drivers 352, which generate appropriate voltages (or currents) to activate one (or more) of the word lines WL0, WL1, and/or WL2 in accordance with a memory operation. Bit lines BL0, BL1, BL2, BL3, BL4, and BL5 extend across respective columns of resistive change memory cells 200 in array 300; each of the bit lines BL0, BL1, BL2, BL3, BL4, and BL5 is coupled to the sources of the pass gates 208 of the resistive change memory cells 200 in a respective column. The number of rows and columns shown in array 300 is reduced for visual clarity; the array typically includes many additional rows and columns. The source of each respective pass gate 208 corresponds to a node 202 (FIG. 2A). In some implementations, each bit line is coupled to a respective multiplexer 362 that couples the bit line to either a read/write (RD/WR) circuit 302 or a CMP line based on a voltage (or current) asserted on a select line of the respective multiplexer 362. The select line of each multiplexer 362 is coupled to a compare enable signal CMP_EN. In some embodiments, a single compare enable signal CMP_EN is used to control the multiplexers 362 in array 300. In the example shown, each multiplexer 362 is controlled by a separate and distinct compare enable signal CMP_EN (e.g., CMP_EN[0], CMP_EN[1], CMP_EN[2], CMP_EN[3], CMP_EN[4], CMP_EN[5]) which allows for the selection of individual multiplexers 362, or subsets of the multiplexers 362.

Each of the word lines WL0, WL1 and WL2, bit lines BL0, BL1, BL2, BL3, BL4, and BL5, and source lines SL0, SL1, and SL2 is a distinct conductive line. In the example shown, a respective source line SL connects to each resistive change memory cell 200 coupled to a respective word line WL of array 300. For example, the source line SL0 connects to the resistive memory element 210 of each resistive change memory cell 200 (e.g., via node 206, FIG. 2A) controlled by word line WL0, the source line SL1 connects to the resistive memory element 210 of each resistive change memory cell 200 controlled by word line WL1, etc. In some embodiments, a single source line SL is used for all resistive change memory cells 200 of array 300. The source line(s) SL are also coupled to source line drivers 350 that provide the appropriate source line voltages to perform memory operations (e.g., set operations, reset operations) on the resistive change memory cells.

Figure 3C:
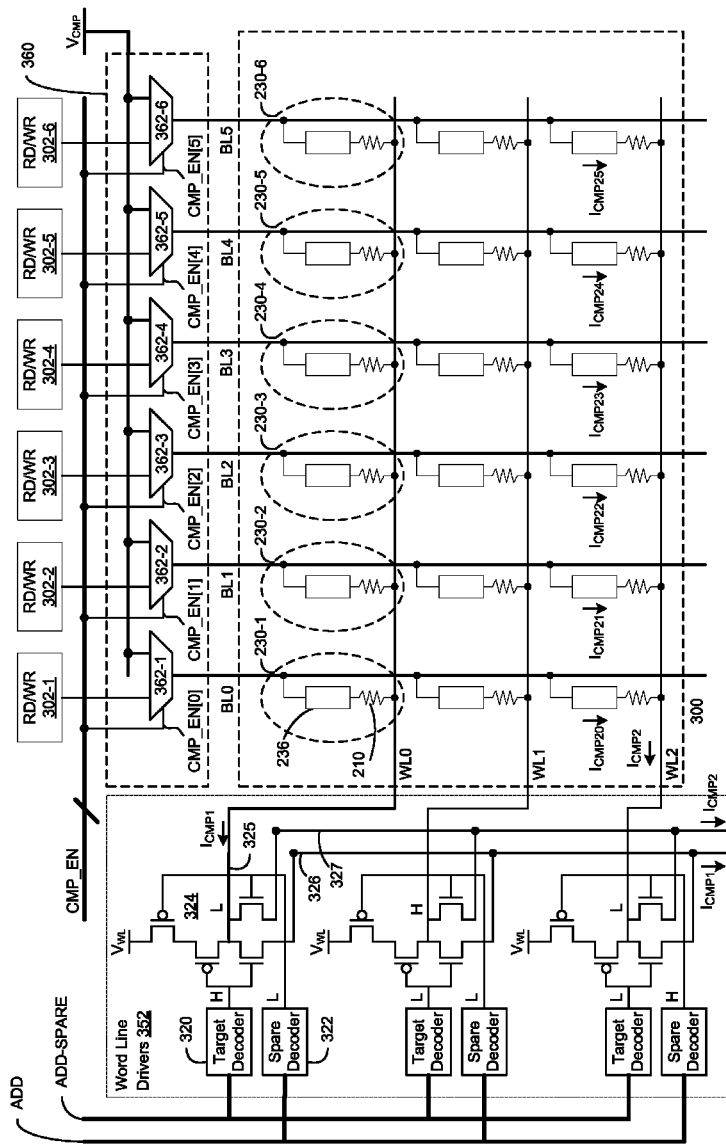
Figure 3D:
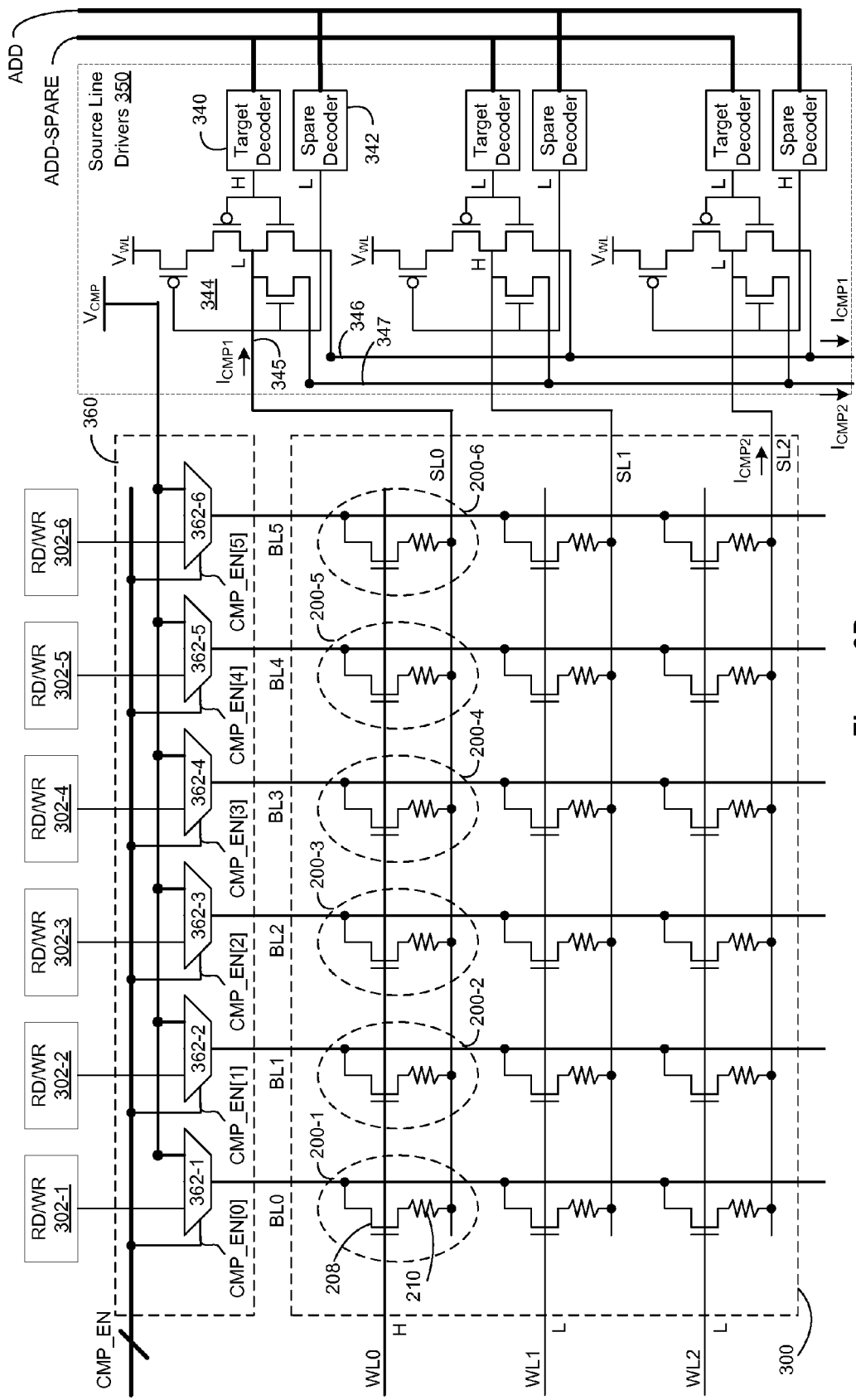

FIGS. 3C and 3D are schematic diagrams of arrays of resistive change memory cells along with circuitry to produce two currents, each corresponding to the future endurance of a respective group (e.g., row) of memory cells, in accordance with some embodiments. Only the differences between FIGS. 3C/3D and FIGS. 3A/3B will described, to avoid needless repetition. The circuitry of FIG. 3C, in comparison with the circuitry of FIG. 3A, includes an array of two-terminal resistive change memory cells 236 in place of three-terminal resistive change memory cells 200 used in the circuitry of FIG. 3A. As a result, there are no source lines and no source line drivers 350 in the circuitry of FIG. 3C. Further, the word line drivers 352 of FIG. 3C include, for each word line (e.g., WL0, WL1, etc.), a target decoder 320, a spare decoder 322, and a driver 324. A respective target decoder 320 is enabled when a set of memory cells on the corresponding word line is being accessed for a memory operation, or to perform a future endurance comparison with another set of memory cells. Similarly, a respective spare decoder 322 is enabled when a set of memory cells the corresponding word line is potentially going to be swapped with a target set of memory cells. From another viewpoint, a respective target decoder 320 is enabled when that target decoder 320 corresponds to the address asserted in the ADD address line. Similarly, a respective spare decoder 322 is enabled when that spare decoder 322 corresponds to the address asserted on the ADD-SPARE address line.

If a respective target decoder 320 is enabled, the current (e.g., $I_{CMP1}$) from the respective word line is routed to output line 326. Similarly, if a respective spare decoder 322 is enabled, the current (e.g., $I_{CMP2}$) from its respective word line is routed to output line 327. The current from a respective word line is the sum of the currents from the set of memory cells on that word line. For example, in FIG. 3C, current $I_{CMP2}$ is equal to the sum of memory cell currents $I_{CMP20}, I_{CMP21} \ldots I_{CMP25}$.

It is noted that both a respective target decoder 320 and a respective spare decoder 322 can be concurrently enabled, so long as the respective target decoder 320 and the respective spare decoder 322 are coupled to different word lines. As a result, two current signals, corresponding to the future endurance of two distinct sets of memory cells, can be concurrently obtained from a single memory array (e.g., a single memory bank in a memory device).

The circuitry in FIG. 3D includes an array of three-terminal memory cells 200, similar to the array of memory cells in FIGS. 3A and 3B. Further, the source line drivers 350 in FIG. 3D are similar to the word line drivers 352 of FIG. 3C. More specifically, the source line drivers 350 of FIG. 3D include, for each source line (e.g., SL0, SL1, etc.), a target decoder 340, a spare decoder 342, and a driver 344. A respective target decoder 340 is enabled when a set of memory cells on the corresponding source line is being accessed for a memory operation, or to perform a future endurance comparison with another set of memory cells. Similarly, a respective spare decoder 342 is enabled when a set of memory cells the corresponding source line is potentially going to be swapped with a target set of memory cells. From another viewpoint, a respective target decoder 340 is enabled when that target decoder 320 corresponds to the address asserted in the ADD address line. Similarly, a respective spare decoder 342 is enabled when that spare decoder 342 corresponds to the address asserted on the ADD-SPARE address line.

If a respective target decoder 340 is enabled, the current (e.g., $I_{CMP1}$) from the respective source line is routed to output line 346. Similarly, if a respective spare decoder 342 is enabled, the current (e.g., $I_{CMP2}$) from its respective source line is routed to output line 347. The current from a respective source line is the sum of the currents from the set of memory cells on that source line.

It is noted that both a respective target decoder 340 and a respective spare decoder 342 can be concurrently enabled, so long as the respective target decoder 340 and the respective spare decoder 342 are coupled to different source lines. As a result, two current signals, corresponding to the future endurance of two distinct sets of memory cells, can be concurrently obtained from a single memory array (e.g., a single memory bank in a memory device).

Figure 4A:
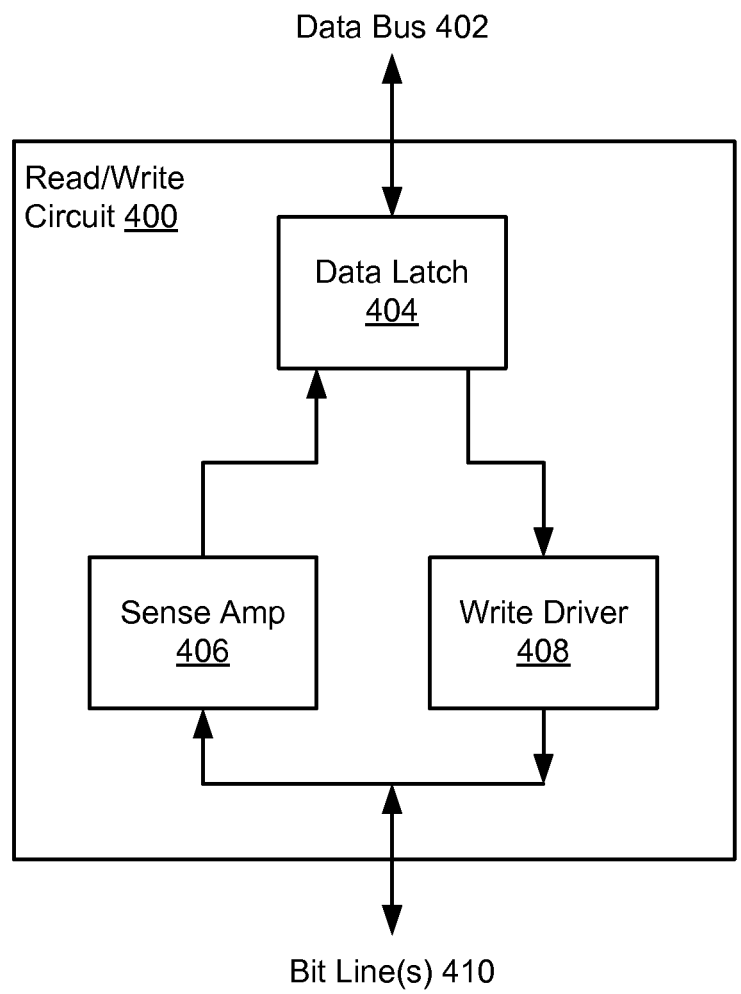
FIG. 4A is a block diagram illustrating a read/write circuit in accordance with some embodiments.

FIG. 4A is a block diagram illustrating a read/write circuit 400 in accordance with some embodiments. The read/write circuit 400 is an example of a read/write circuit 302 (FIGS. 3A-3D). A bit line 410 is coupled to a sense amplifier 406 and a write driver 408. In one example, read/write circuit 400 corresponds to the read/write circuit 302-1 (FIGS. 3A-3D) and the bit line 410 corresponds to a respective bit line such as any of bit lines BL0 to BL 5 (FIGS. 3A-3D). In read/write circuit 400, sense amplifier 406 is arranged in parallel with write driver 408, and both are coupled to a data latch 404. The sense amplifier 406 and write driver 408 thus are both coupled between the bit line(s) 410 and the data latch 404.

Figure 4B:
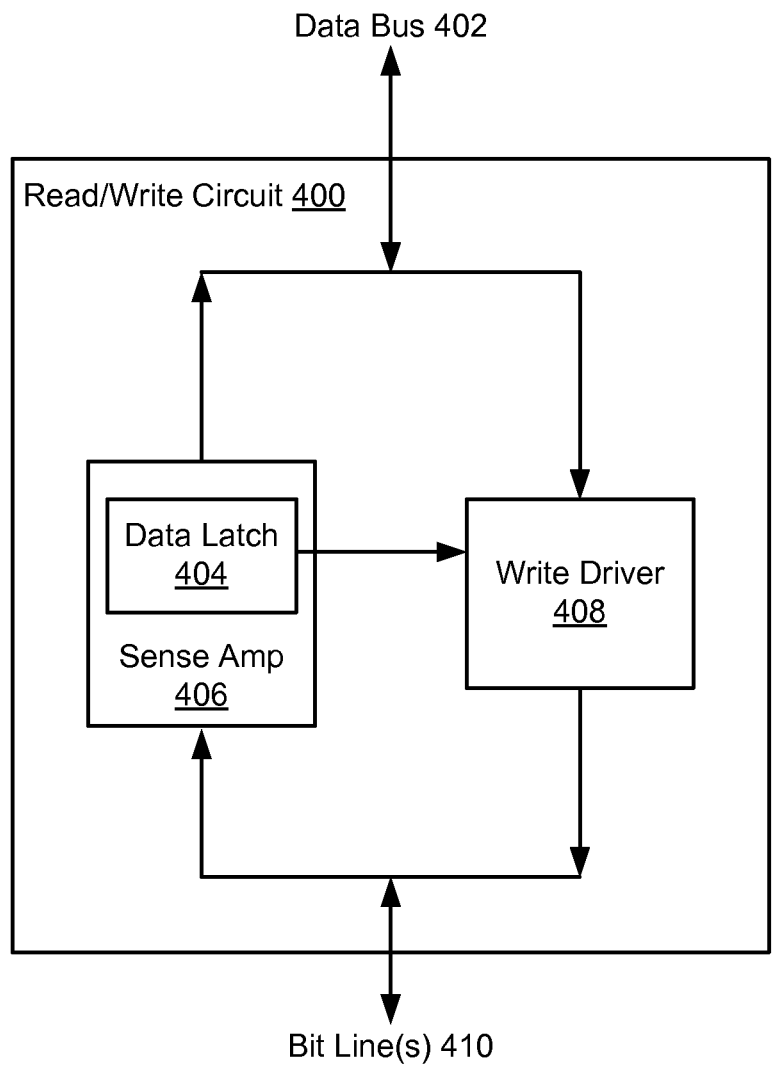
FIG. 4B is a block diagram illustrating an alternative implementation of read/write circuit in accordance with some embodiments.

FIG. 4B is a block diagram illustrating an alternative implementation of read/write circuit 400 in accordance with some embodiments. As illustrated in FIG. 4B, sense amp 406 includes data latch 404. Furthermore, sense amp 406 and write driver 408 are coupled in parallel with each other between the data bus 402 and bit line(s) 410.

The following discussion refers to either of the read/write circuits 400 illustrated in FIGS. 4A and 4B. The sense amplifier 406 determines values of data read from resistive change memory cells connected to the bit line(s) 410 and provides the determined values to the data latch 404. Data latch 404 stores the values of the data and forwards the values onto a data bus 402. Data bus 402 is coupled, for example, to an interface (e.g., interface 1003, FIG. 10) to transmit the data to a separate device (e.g., to a memory controller that requested the data.) Data bus 402 also provides data to data latch 404 (e.g., data provided by a memory controller for storage in the resistive change memory device). Data latch 404 stores the data and forwards the data to write driver 408, which drives the data onto bit line(s) 410 by supplying to the bit line(s) 410 the appropriate voltages for set or reset operations, depending on the value(s) of the data. Write driver 408 thus is used to program resistive change memory cells connected to the bit line(s) 410.

Figure 5:
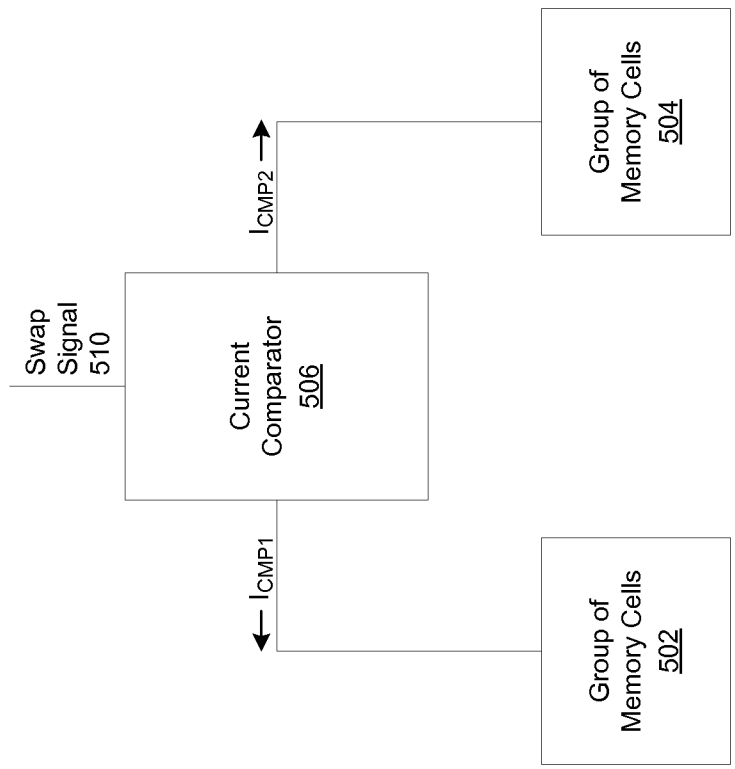
FIG. 5 is a block diagram illustrating a current comparator that compares currents from groups of memory cells to generate a swap signal in accordance with some embodiments.

As discussed above, the embodiments described herein swap a first group of memory cells with an additional group of memory cells when the difference in the future endurance between the first group and the additional group exceeds a predetermined threshold difference. Whether the swap operation is performed depends only on the magnitude (and not on the sign) of the difference in future endurance. The swap operation is performed when the future endurance of the additional group of memory cells is greater than that of the first group of memory cells by the threshold difference. The swap operation is also performed when the future endurance of the first group of memory cells is greater than that of the additional group of memory cells by the threshold difference. In some embodiments, a current through a memory cell (or group of memory cells) is used as a proxy indicator for the future endurance of the memory cell (or the group of memory cells). In some embodiments, the difference in the future endurance between the first group of memory cells and the additional group of memory cells is identified in response to memory array 300 receiving a write operation. In some embodiments, the difference in the future endurance between the first group of memory cells and the additional group of memory cells is identified in response to memory array 300 receiving a wear-leveling operation, e.g., a wear-leveling operation performed in the background or during idle times when memory array 300 is not being used. FIG. 5 is a block diagram illustrating a current comparator that compares currents from groups of memory cells to generate a swap signal in accordance with some embodiments. As illustrated in FIG. 5, the current comparator 506 compares current $I_{CMP1}$ for a group of memory cells 502 (e.g., a first group of memory cells) with current $I_{CMP2}$ for a group of memory cells 504 (an additional group of memory cells) and generates a swap signal 510 based on the comparison of currents $I_{CMP1}$ and $I_{CMP2}$, as described in more detail below.

The following discussion illustrates an example of a process for obtaining a respective current for a group of memory cells. In some embodiments, the currents $I_{CMP1}$ and $I_{CMP2}$ are obtained from two different memory blocks of a memory device. Note that a memory block is a set of memory cells that share a group of word line drivers, source line drivers, and sense amplifiers. For example, array 300 may be a memory block. In another example, a memory bank may be a memory block. In general, a memory device may include multiple memory blocks. In FIG. 3A, when the difference in the future endurance between the first group of memory cells and the additional group of memory cells is to be identified, the CMP_EN signal is set so that the multiplexers 362 couple the bit lines BL0, BL1, BL2, BL3, BL4, and BL5 to RD/WR drivers 302-1, 302-2, 302-3, 302-4, 302-5, and 302-6, respectively. The word line drivers 352 activate the resistive change memory cells 200 in the appropriate word line, e.g., the word line corresponding to the write operation, the word line that corresponds to a spare row of array 300, etc., when the future endurance of the resistive change memory cells 200 in a row of array 300 is to be compared. Alternatively, the word line drivers 352 activate the resistive change memory cells 200 controlled by one or more appropriate word lines, e.g., the word line corresponding to the write operation, the word line that correspond to a spare row of array 300, etc., when the future endurance of the resistive change memory cells 200 in a column of array 300 is to be compared. The RD/WR drivers 302-1, 302-2, 302-3, 302-4, 302-5, and 302-6 then program the activated resistive change memory cells 200 to a predetermined state, i.e., a set state or a reset state. As illustrated in FIG. 3A, the RD/WR drivers 302-1, 302-2, 302-3, 302-4, 302-5, and 302-6 apply zero volts to the bit lines BL0, BL1, BL2, BL3, BL4, and BL5 and the source line drivers 350 apply a voltage $V_{RESET}$ to source line SL0 to program the activated resistive change memory cells 200 to the reset state.

After programming the activated resistive change memory cells 200 to the predetermined state, e.g., the reset state, the CMP_EN signal is set so that the multiplexers 362 couple the bit lines BL0, BL1, BL2, BL3, BL4, and BL5 to the CMP line, as illustrated in FIG. 3B. To obtain the current $I_{CMP}$ for the activated resistive change memory cells 200, the source line drivers 350 apply zero volts to source line SL0.

In the examples shown in FIGS. 3C and 3D, currents $I_{CMP1}$ and $I_{CMP2}$ are obtained concurrently from two different rows of a memory block in a memory device.

Figure 6:
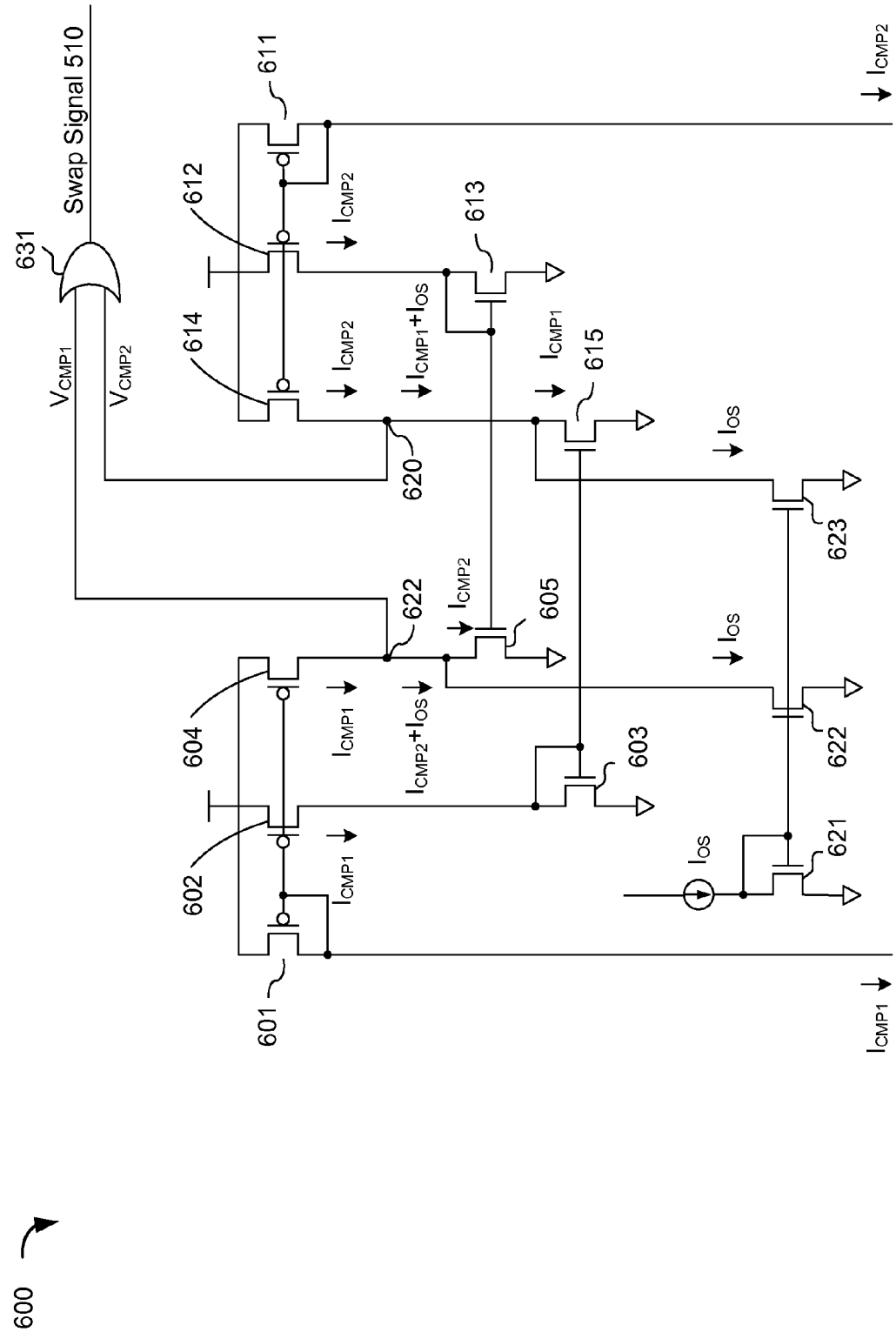
FIG. 6 is a block diagram illustrating a current comparator circuit in accordance with some embodiments.

FIG. 6 is a circuit diagram illustrating an example of a current comparator circuit 600 in accordance with some embodiments. The current comparator circuit 600 may be an implementation of the current comparator 506 (FIG. 5). As illustrated in FIG. 6, transistor 601 mirrors current $I_{CMP1}$ to transistors 602 and 604. Similarly, transistor 611 mirrors current $I_{CMP2}$ to transistors 612 and 614. Transistor 621 mirrors an offset current $I_{OS}$ to transistors 622 and 623. The offset current $I_{OS}$ is used to introduce an offset in the comparison of the currents $I_{CMP1}$ and $I_{CMP2}$. The offset in currents is used as a proxy for the predetermined threshold difference in future endurance used to evaluate whether to perform a swap operation, as described herein.

Transistor 603 mirrors the mirrored version of the current $I_{CMP1}$ to transistor 615, which is combined with the mirrored version of the offset current $I_{OS}$ from transistor 623. Accordingly, the current in the branch below node 620 is $I_{CMP1}+I_{OS}$. The current in the branch above node 620 is $I_{CMP2}$. Thus, the value of the voltage $V_{CMP2}$ on node 620 is a high logic value when $I_{CMP1}<I_{CMP2}-I_{OS}$. Similarly, transistor 613 mirrors the mirrored version of the current $I_{CMP2}$ to transistor 605, which is combined with the mirrored version of the current $I_{OS}$ from transistor 622. Accordingly, the current in the branch below node 622 is $I_{CMP2}+I_{OS}$. The current in the branch above node 622 is $I_{CMP1}$. Thus, the value of the voltage $V_{CMP2}$ on node 622 is a high logic value when $I_{CMP1}>I_{CMP2}+I_{OS}$.

Voltages $V_{CMP1}$ and $V_{CMP2}$ are coupled to respective inputs of an OR gate 631. Thus, the swap signal 510 is high when $I_{CMP1}>I_{CMP2}+I_{OS}$ or when $I_{CMP1}<I_{CMP2}-I_{OS}$. In other words, the swap signal 510 is high when $I_{OS}<|I_{CMP1}-I_{CMP2}|$. Note that instead of using the OR gate 631, the OR gate 631 may be replaced with an XOR gate in some implementations. It is further noted that the voltages on nodes 620 and 622 cannot both be at a high logic value at the same time.

The swap signal 510 generated by the current comparator 500 is used to control a wear leveling scheme implemented to mitigate degradation of resistive change memory cells. Examples of such a scheme include schemes in which respective groups of resistive change memory cells (e.g., rows or columns) are swapped with one or more spare groups of resistive change memory cells (e.g., one or more spare rows and/or spare columns) to even out usage of the respective groups. Wear leveling schemes are particularly useful for systems in which certain groups of resistive change memory cells are programmed disproportionately. In the absence of a wear leveling scheme, these groups of resistive change memory cells would wear out more quickly than other resistive change memory cells in the device, thus limiting the overall endurance of the device notwithstanding the existence in the device of many resistive change memory cells with long future endurances.

Figure 7A:
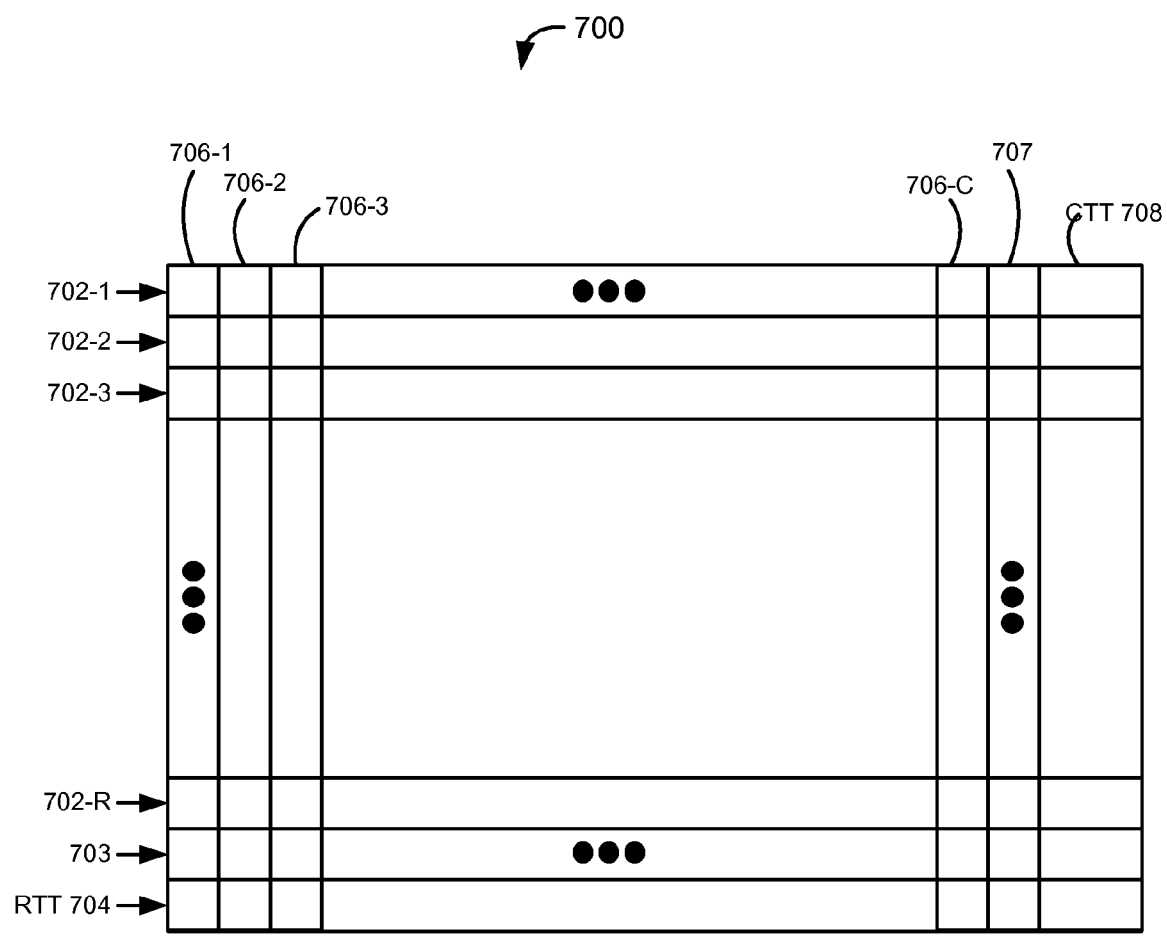
FIGS. 7A and 7B represent banks of resistive change memory cells with spare rows and columns in accordance with some embodiments.

FIG. 7A represents an array or bank 700 of resistive change memory cells (e.g., resistive change memory cells 200, 220, 230, or 240, FIGS. 2A-2D) in a resistive change memory device in accordance with some embodiments. In some embodiments, the bank 700 is a logical representation of a bank of resistive change memory cells. In these embodiments, the physical implementation of the bank 700 may be different than illustrated in FIG. 7A. For example, the (logical) bank 700 may be subdivided in either direction (e.g., columns in groups of columns in the (logical) bank 700 may be distributed across one or more physical banks). Bank 700 includes R rows 702-1 through 702-R and a spare row 703, where R is an integer greater than one. Typically, R is equal to $2^r$, where r is an integer greater than or equal to 8, but other values of R can be used in other implementations. Optionally, bank 700 also includes C groups of columns 706-1 through 706-C and a spare group of columns 707, where C is an integer greater than one. Typically, C is equal to $2^c$, where c is an integer greater than or equal to 6, but other values of C can be used in other implementations.

Each group of columns 706 includes a specified number of columns. In some examples, the specified number of columns is equal to the data width of the resistive change memory device (e.g., 8 columns for a x8 device, 16 columns for a x16 device, etc.). In other examples, the specified number of columns is greater than the data width of the resistive change memory device. For example, in some implementations the specified number of columns corresponds to 4, 8 or 16 bytes of data.

While bank 700 is shown with a single spare row 703 and a single spare group of columns 707, in some embodiments bank 700 includes two or more (e.g., four or more) spare rows 703 and/or two or more (e.g., four or more) spare groups of columns 707. In some embodiments, bank 700 includes one or more spare rows 703 but does not include any spare groups of columns 707. In other embodiments, bank 700 includes one or more spare groups of columns 707 but does not include any spare rows 703.

When the device containing bank 700 is initialized for use (e.g., when a system containing the device is powered on or calibrated), resistive change memory cells in rows 702-1 through 702-R and groups of columns 706-1 through 706-C are available for use, while the spare row 703 and spare group of columns 707 are not available for use. During use, the wear leveling scheme swaps rows 702 that are available for use with spare row(s) 703 and/or swaps groups of columns 706 that are available for use with spare group(s) of columns 707. In some implementations, the process of swapping a row 702 that is available for use (and/or swapping a group of columns 706 that is available for use) with a spare row 703 (and/or with a spare group of columns 707) includes (1) transferring data from the row 702 that is available for use (and/or the group of columns 706 that is available for use) to the spare row 703 (and/or the spare group of columns 707) and (2) remapping logical addresses corresponding to the row 702 that is available for use (and/or remapping logical addresses corresponding to the group of columns 706 that is available for use) to physical addresses corresponding to the spare row 703 (and/or physical addresses corresponding to the spare group of columns 707). In some implementations, the row 702 that was available for use (and/or the group of columns 706 that was available for use) from which data was transferred to the spare row 703 (and/or the spare group of columns 707) is designated as a spare row 703 (and/or a spare group of columns 707) at the conclusion of the swapping process.

In an example of row swapping, a first row 702-1 is swapped with spare row 703. After this swap, the first row 702-1 becomes the spare row and is no longer available for use, and operations that would have accessed the first row 702-1 now access the row 703, which is no longer the spare row. Subsequently, the third row 702-3 is swapped with the first row 702-1. In response, the third row 702-3 becomes the spare row and is no longer available for use, and operations that would have accessed the third row 702-3 now access the first row 702-1, which is no longer the spare row. Additional swaps are performed in the same manner.

In some embodiments, column swapping is performed by analogy to row-swapping, but on a per-row basis. In an example, the first group of columns 706-1 is swapped with the spare group of columns 707 in the second row 702-2, but not in any other rows 702. After this swap, the first group of columns 706-1 becomes the spare group of columns and is no longer available for use in the second row 702-2. Operations that would have accessed the first group of columns 706-1 in the second row 702-2 now access the spare group of columns 707. Operations that would have accessed the first group of columns 706-1 in any other row 702 still access the first group of columns 706-1, however. Subsequently, the second group of columns 706-2 is swapped with the first group of columns 706-1 in the second row 702-2. In response, the second group of columns 706-2 becomes the spare group of columns and is no longer available for use in the second row 702-2. Operations that would have accessed the second group of columns 706-2 in the second row 702-2 now access the first group of columns 706-1. Operations that would have accessed the second group of columns 706-2 in any other row 702 still access the second group of columns 706-2, however.

Alternatively, in some implementations, groups of columns 706 are swapped with respect to all rows, such that the group of columns 706 that becomes the spare group of columns is unavailable for every row. Additional swaps are performed in the same manner.

To implement row swapping, or column swapping, or both, bank 700 includes a row translation table (RTT) 704, or a column translation table (CTT) 708, or both. While FIG. 7A shows tables 704 and 708 being implemented in bank 700, tables 704 and 708 alternatively are implemented in one or more memory banks distinct from bank 700 in the resistive change memory device, or in one or more memory devices in the memory controller (e.g., memory controller 1002, FIG. 10). Row translation table 704 maps row addresses as specified for access operations to physical row addresses in bank 700, as illustrated below with respect to FIGS. 8A-8C, thereby associating the specified row addresses with respective physical row addresses. Likewise, column translation table 708 maps column addresses (e.g., respective addresses for respective groups of columns) as specified for access operations to physical column addresses in bank 700, as illustrated below with respect to FIGS. 9A-9C. In some embodiments, column swapping is performed on a per-row basis and a separate column translation table 708 is included for each row 702.

Figure 7B:
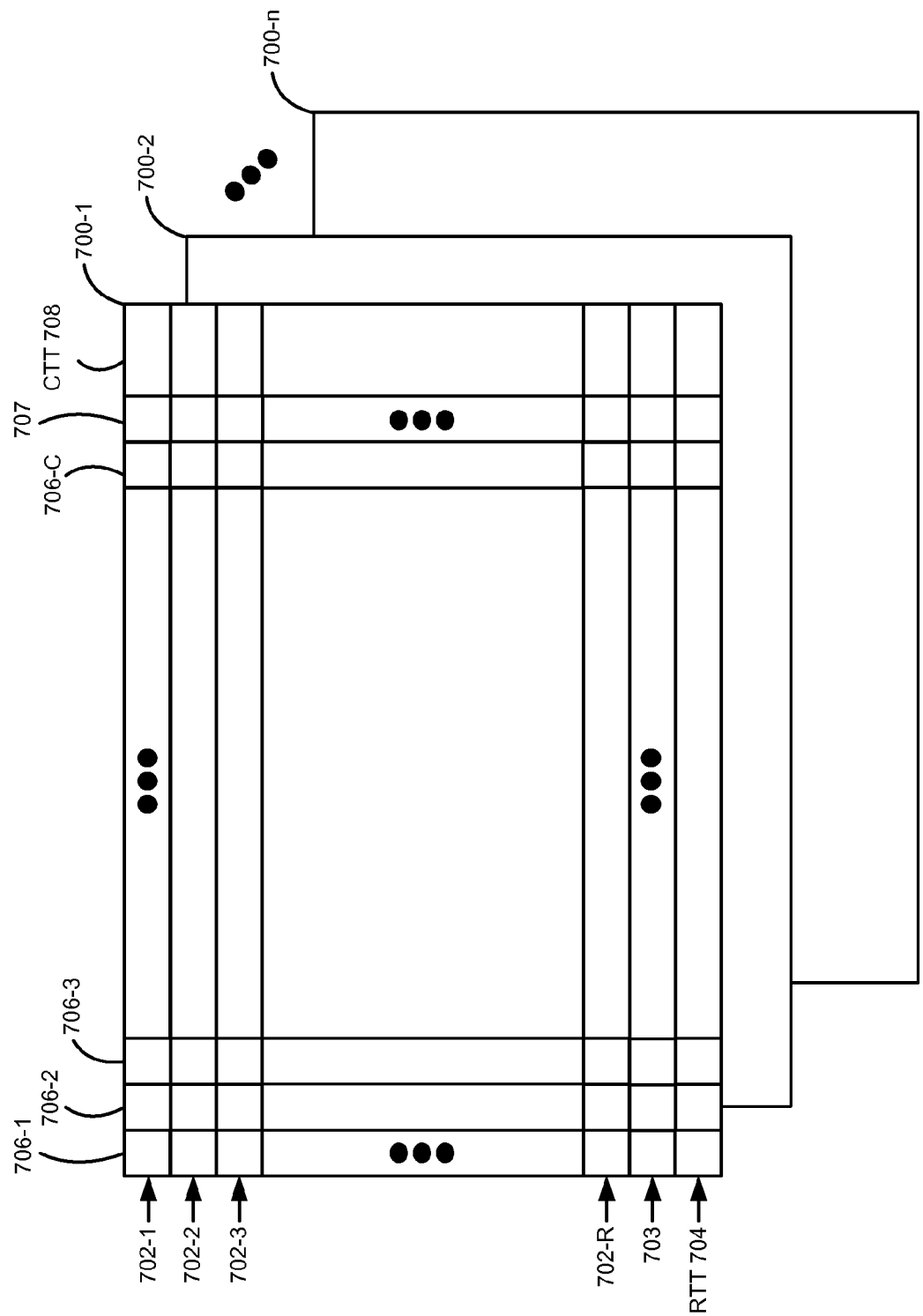

In some embodiments, a resistive change memory device includes multiple banks FIG. 7B illustrates multiple banks 700-1 through 700-n, where n is an integer greater than one, in accordance with some embodiments. For example, n equals two, or four, or eight or more. Each bank 700-1 through 700-n is an example of a bank 700 (FIG. 7A). In some embodiments, each bank 700-1 through 700-n includes a row translation table 704 for swapping rows within the bank but not between banks. In some embodiments, each bank 700-1 through 700-n also includes a column translation table 708 (or a set of row-specific column translation tables) for swapping groups of columns within the bank but not between banks. Alternatively, a memory device (or a memory controller coupled to the device) includes a global row translation table for swapping any row in any bank with any spare row in any bank and/or a global column translation table for swapping any group of columns in any bank with any spare group of columns in any bank.

FIGS. 8A-8C illustrate the operation of a programmable row translation table 800 (e.g., RTT 704, FIGS. 7A-7B) in accordance with some embodiments. Table 800 includes a number of indexed entries equal to the number of rows in a bank 700 (or alternatively, in an entire memory device). The entries have indices 802-1 through 802-R, each of which corresponds to (e.g., equals) a distinct logical row address to be translated. In the following discussion, the entry with index 802-1 is referred to as entry 822-1, the entry with index 802-2 is referred to as entry 822-2, and so on. Each entry stores the physical address of a distinct row 702. For example, in FIG. 8A entry 822-1 stores the physical address of row 702-1, entry 822-2 stores the physical address of row 702-2, entry 822-3 stores the physical address of row 702-3, and entry 822-R stores the physical address of row 702-R. Note that in FIGS. 8A-8C, the reference numbers for the rows 702 (e.g., 702-1, 702-2, 702-3, etc.) are used to represent the physical addresses for the corresponding rows 702. For example, the reference number 702-1 in the entry 822-1 refers to the physical address of row 702-1.

To translate a row address, the entry having an index that corresponds to (e.g., equals) the row address to be translated is accessed and the physical address stored in the entry is read from the entry and used as the translated address (sometimes herein called the translated row address). Table 800 of FIG. 8A does not include an entry storing the physical address of row 703, which indicates that row 703 is configured as a spare row that is not in use. Because there is no entry storing the physical address of row 703, row 703 cannot be accessed. Optionally, a value identifying the spare row is stored in a register 804 (herein called spare row register 804) that is associated with table 800, or alternatively is an additional entry of table 800 that is not used for translating a received row address into a physical row address. Initially, spare row register 804 stores a value identifying row 703 as the spare row.

FIG. 8B illustrates table 800 after the first row 702-1 has been swapped with the spare row 703. Entry 822-1 now stores the physical address of the row 703. An address corresponding to (e.g., equal to) index 802-1 thus will be translated to the physical address of row 703, instead of the physical address of the first row 702-1 as in FIG. 8A. None of the entries 822-1 to 822-R stores the physical address of the first row 702-1, indicating that the first row 702-1 is not in use and is now the spare row. Optionally, spare row register 804 stores a value identifying the spare row as first row 702-1.

FIG. 8C illustrates table 800 after the third row 702-3 is subsequently swapped with the spare row 702-1. (Row 703 is no longer spare, because it was swapped with the first row 702-1). Entry 822-3 now stores the physical address of the first row 702-1. An address corresponding to (e.g., equal to) index 802-3 thus will be translated to the physical address of the first row 702-1, instead of the physical address of row 702-3 as in FIG. 8B. None of the entries 822-1 to 822-R stores the physical address of the third row 702-3, indicating that the third row 702-3 is not in use and is now the spare row. Entry 822-1 still stores the physical address of row 703, as in FIG. 8B. Optionally, spare row register 804 stores a value identifying the spare row as third row 702-3.

Row translation table 800 is used to perform additional row swaps in the same manner as the row swaps illustrated in FIGS. 8A-8C.

FIGS. 9A-9C illustrate a programmable column translation table 900 (e.g., CTT 708, FIGS. 7A-7B) in accordance with some embodiments. The discussion below with reference to FIGS. 9A-9C may be applied to embodiments in which all rows of a column group are swapped. Alternatively, discussion below with reference to FIGS. 9A-9C may be applied to embodiments in which a subset of the rows in the column group are swapped. In the latter case, the translation table 900 is a translation table for the subset of the rows. Each subset of rows would have a corresponding translation table. For example, when individual rows of a column group can be swapped independently of other rows, there are R translation tables. Table 900 includes a number of indexed entries equal to the number of groups of columns in a bank 700 (or alternatively, in an entire memory device). The entries have indices 902-1 through 902-C, each of which corresponds to (e.g., equals) a distinct column address to be translated, or a portion of a distinct column address to be translated. For example, if the number of columns in a group of columns 706 is greater than the data width of the device, each entry corresponds to a most-significant portion of a set of column addresses (e.g., one or more least significant bits of the column address are ignored and are not translated).

In the following discussion, the entry with index 902-1 is referred to as entry 922-1, the entry with index 902-2 is referred to as entry 922-2, and so on. Each entry stores a physical address of a distinct group of columns 706. For example, in FIG. 9A entry 922-1 stores the physical address of column group 706-1, entry 922-2 stores the physical address of column group 706-2, entry 922-3 stores the physical address of column group 706-3, and entry 922-C stores the physical address of column group 706-C. Note that in FIGS. 9A-9C, the reference numbers for the column groups 706 (e.g., 706-1, 706-2, 706-3, etc.) are used to represent the physical addresses for the corresponding column groups 706. For example, the reference number 706-1 in the entry 922-1 refers to the physical address of column group 706-1. To translate a column address (or portion thereof), the entry having an index that corresponds to (e.g., equals) the column address (or portion thereof) to be translated is accessed and the physical address stored in the entry is read from the entry and used as the translated address (sometimes herein called the translated column address, or translated column group address), by analogy to the table 800 (FIGS. 8A-8C). Table 900 of FIG. 9A does not include an entry storing the physical address of column group 707, which indicates that column group 707 is configured as a spare group of columns that is not in use. Because there is no entry storing the physical address of column group 707, column group 707 "cannot be accessed" (i.e., cannot be accessed using read and write commands that specify logical addresses). Alternatively, in some implementations column group 707 cannot be accessed via standard memory access operations, such as standard read and write operations performed in response to standard read and write commands (specifying logical addresses to be accessed in the memory device) received from a memory controller or other host device, but are accessible during via supplemental commands, such as device calibration commands and/or internally generated commands. Optionally, a value identifying the spare column group is stored in a register 904 (herein called spare column register 804) that is associated with table 900, or alternatively is an additional entry of table 900 that is not used for translating a received column address into a physical column address. Initially, spare column register 904 stores a value identifying column group 702-C' as the spare column group.

FIG. 9B shows the result of swapping the first column group 706-1 with the spare column group 707, such that the first column group 706-1 becomes the spare column group. Optionally, spare column register 904 stores a value identifying the spare column group as first column group 706-1.

FIG. 9C shows the result of subsequently swapping the second column group 706-2 with the spare column group 706-1, such that the second column group 706-2 becomes the spare group of columns. Optionally, spare column register 904 stores a value identifying the spare column group as second column group 706-2. These and additional swaps are performed by analogy to the row swaps described with respect to FIGS. 8A-8C.

Figure 10:
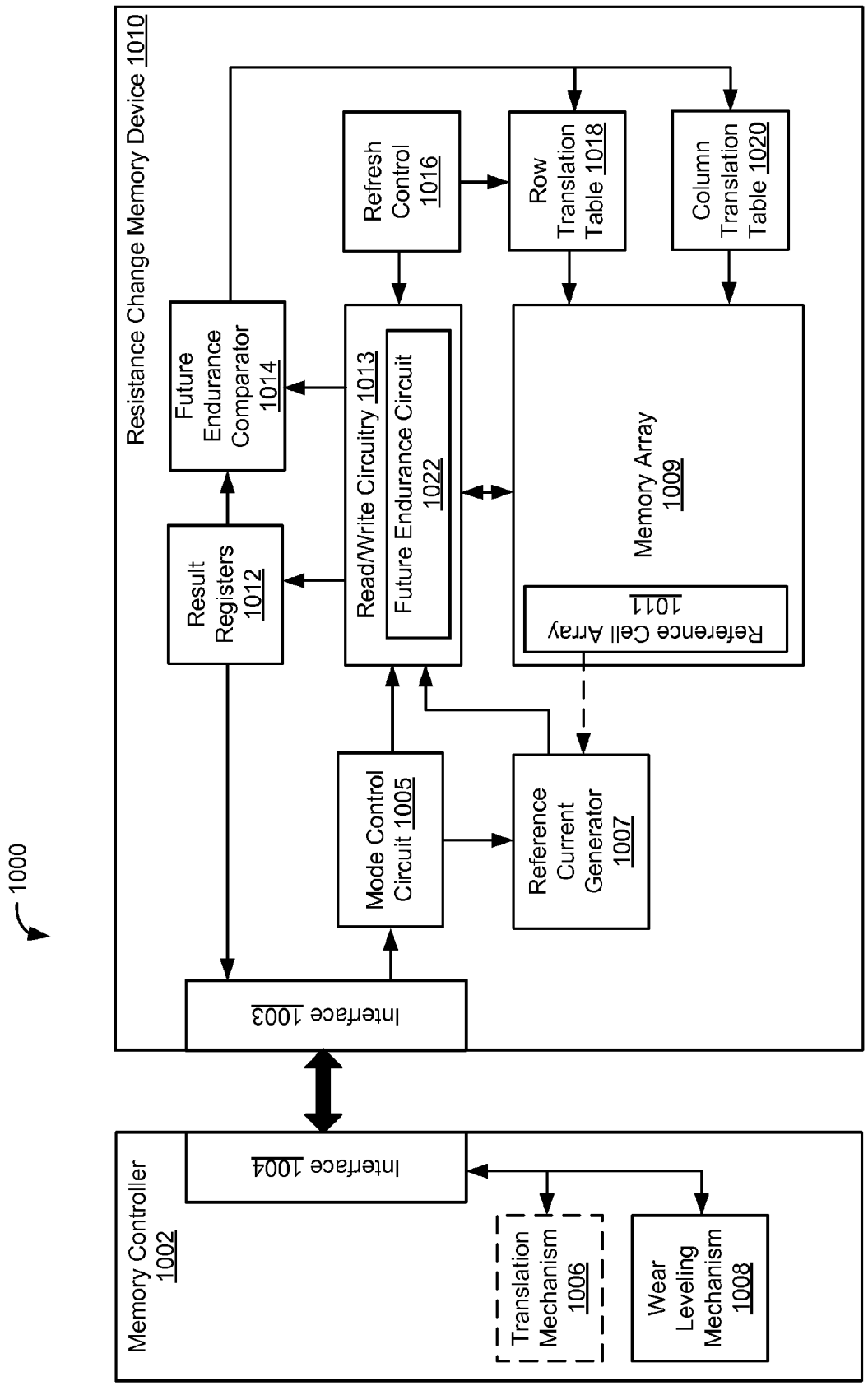
FIG. 10 is a block diagram of a system including a memory controller and a resistive change memory device in accordance with some embodiments.

FIG. 10 illustrates a system 1000 for implementing row and column swapping in accordance with some embodiments. In the system 1000, a memory controller 1002 is coupled to a memory device 1010. FIG. 10 is not intended to include a complete schematic diagram of memory device 1010 but instead illustrates components of memory device 1010 corresponding to disclosed embodiments. Device 1010 includes interface 1003, mode control circuit 1005, reference current generator 1007, memory array 1009, and read/write circuitry 1013. Memory array 1009 of the device 1000 includes one or more banks of resistive change memory cells (e.g., one or more banks 700, FIGS. 7A-7B). Mode control circuit 1005 is coupled to read/write circuitry 1013 and reference current generator 1007. Mode control circuit 1005 instructs the read/write circuitry 1014 and reference current generator 1008 to enter a first mode (e.g., a normal operating mode) to perform read (and write) operations and to enter a second mode (e.g., a test mode) to perform future endurance measurement and comparison operations. In some embodiments, mode control circuit 1005 specifies the mode in response to a command or instruction received from an external device (e.g., a memory controller) via interface 1003. In some embodiments, mode control circuit 1005 includes one or more state machines for carrying out the sequences of internal operations to perform memory operations corresponding to commands received from an external device, such as a memory controller. In some implementations, interface 1003 is not present in the memory device 1010. In these implementations, result registers 1012 provide the result signal directly to an external device and mode control circuit 1005 receives a command or instruction from an external device.

In some implementations, memory device 1010 includes an array of reference resistive change memory cells (reference cell array 1011) that is coupled to reference current generator 1007. Reference current generator 1007 is configurable to provide any of multiple reference currents to the read/write circuitry 1013 for read operations.

In some embodiments, a future endurance circuit 1022 of the read/write circuitry 1013 is arranged to perform a future endurance measurement operation on a group of resistive change memory cells. In some embodiments, a metric corresponding to the future endurance of the group of resistive change memory cells is measured by measuring a resistance. In some embodiments, a metric corresponding to the future endurance of the group of resistive change memory cells is measured by measuring a current. In some embodiments, the group of resistive change memory cells includes one or more rows of resistive change memory cells in memory array 1009. In some embodiments, the group of resistive change memory cells includes one or more columns of resistive change memory cells in memory array 1019. Typically, the future endurance circuit 1022 outputs the result of a future endurance measurement as a digital code, but other ways of representing such result are possible and may be used.

In some embodiments, device 1010 includes result registers 1012, including a first result register to store the result of a future endurance measurement operation for a specified group of resistive change memory cells (e.g., a row or a group of columns with a row) and a second result register to store the result of a future endurance measurement operation for a spare group of resistive change memory cells (e.g., a spare row or a spare group of columns within a row). In an example, result registers 1012 store respective digital values representing the results of future endurance measurements performed by future endurance circuit 1022. Result registers 1012 provide the stored future endurance measurement results to a future endurance comparator 1014, which compares the results. Future endurance comparator 1014 determines when the specified group of resistive change memory cells and the spare group of resistive change memory cells differ in future endurance by a difference that exceeds a predetermined threshold difference. Future endurance comparator 1014 thus acts to compare the future endurance of a spare, not-currently-used group of resistive change memory cells to the future endurance of a specified group of resistive change memory cells distinct from the spare, currently-not-used group and a threshold. In an example, future endurance comparator 1014 converts respective currents corresponding to the future endurance of the spare group of memory cells and the future endurance of the specified group of memory cells to digital values, performs arithmetic operations to obtain a digital value representing the difference between the digital values and performs a logic operation to determine whether the digital value representing the difference is greater than a digital value representing the threshold difference.

In some alternative embodiments, result registers 1012 and future endurance comparator 1014 are replaced with an analog comparator circuit, such as the one shown in FIG. 6.

Future endurance comparator 1014 is coupled to one or more row translation tables 1018 (e.g., a table 800 for each bank 700 or a single, global table 800, FIGS. 8A-8C) and/or one or more column translation tables 1020 (e.g., a table 900 for each bank 700 or for each row within a bank 700, or a single, global table 900, FIGS. 9A-9C). While the translation tables 1018 and 1020 are shown separately from the array 1009, in some embodiments they are implemented in the array 1009 (e.g., as shown for RTT 704 and CTT 708, FIGS. 7A-7B). When future endurance comparator 1014 determines that the difference in future endurance (i.e., the difference in the currents or other metric corresponding to future endurance) between a specified group of resistive change memory cells and the spare group of resistive change memory cells exceeds the predetermined threshold difference, future endurance comparator 1014 instructs a row translation table 1018 or column translation table 1020, as appropriate, to swap the spare group of resistive change memory cells with the specified group of resistive change memory cells (e.g., by copying data from the row and/or group of columns to be swapped to the spare row and/or spare group of columns and performing a remapping as illustrated in FIGS. 8A-8C and 9A-9C). Thus, the swapping occurs regardless of whether the spare group of resistive change memory cells has better or worse future endurance than the specified group of resistive change memory cells, so long as the difference in future endurance exceeds the predetermined threshold difference. If a comparison performed by future endurance comparator 1014 does not indicate a difference in future endurance between the specified and spare groups of resistive change memory cells exceeds the predetermined threshold difference, no swapping occurs.

In some embodiments, the resistive change memory cells in the array 1009 are volatile, and the device 1010 includes refresh control circuitry 1016 to perform refresh operations. In other embodiments, the resistive change memory cells are nonvolatile and refresh operations are not performed. In some embodiments, row swapping is performed during refresh operations, under the control of the refresh control circuitry 1016. The future endurance of the row being refreshed is compared to the future endurance of a spare row. If a difference in future endurance is detected (or alternatively, if a difference in future endurance that is greater than a threshold difference is detected, where the threshold difference is a non-zero value), the rows are swapped.

Interface 1003 of device 1010 is coupled to interface 1004 of memory controller 1002. (Memory controller 1002 is also coupled to one or more processors and, in some embodiments, a multi-level cache memory, not shown.) In some embodiments, the controller 1002 includes a wear leveling mechanism 1008 to instruct the device 1010 to perform future endurance measurement operations and, based on the results, to swap rows and/or columns. In some embodiments, the result registers 1012 and/or future endurance comparator 1014 are implemented in a translation mechanism 1006 in the controller 1002, instead of in the device 1010. In some embodiments, the row translation table 1018 and/or column translation table 1020 also are implemented in the translation mechanism 1006 instead of in the device 1010.

Figure 11A:
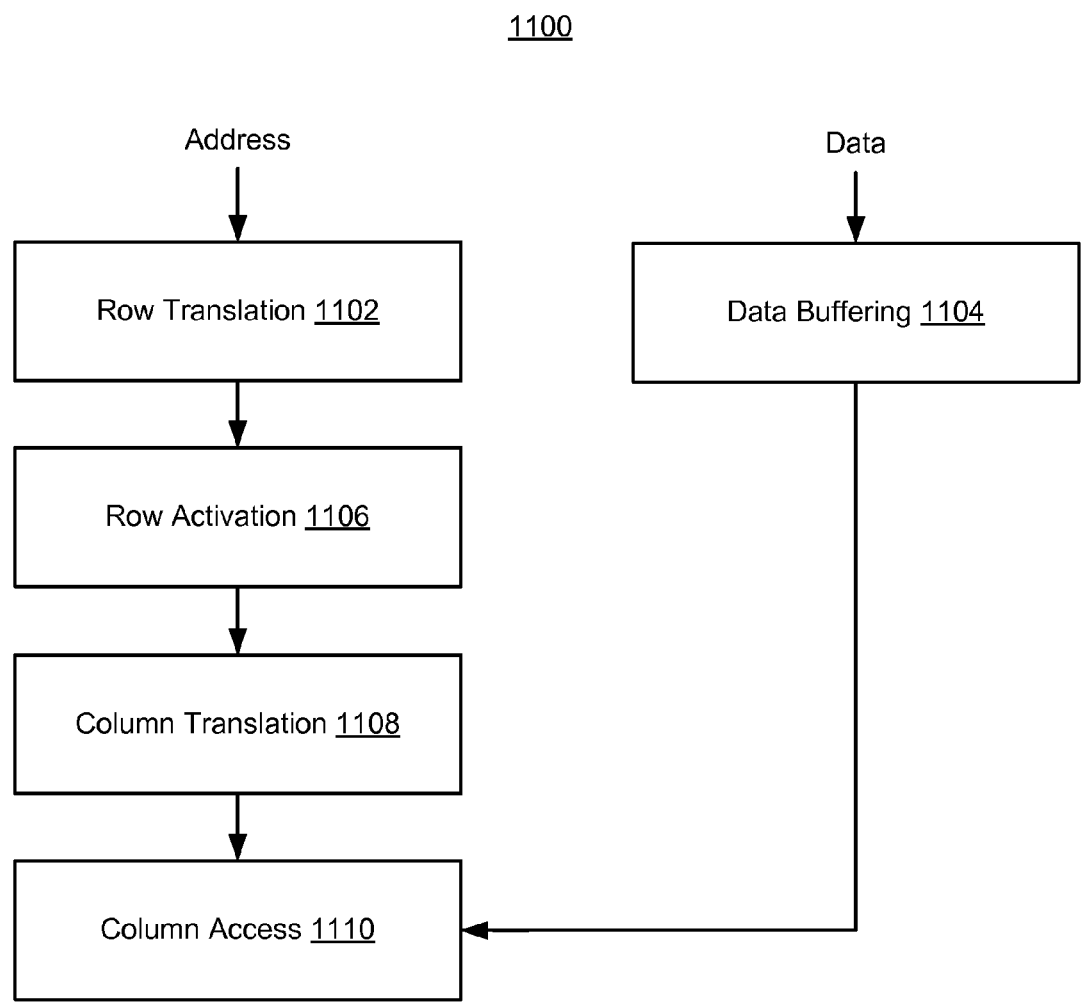
FIGS. 11A and 11B are flow diagrams illustrating methods of performing memory access operations using address translation in accordance with some embodiments.

Memory access operations performed using address translation (e.g., as performed using tables 704 and/or 708, FIGS. 7A-7B; tables 1018 and/or 1020, FIG. 10) will now be described. FIG. 11A is a flow diagram illustrating a method 1100 of performing a write operation to memory device 1010 (i.e., a method of programming memory cells in memory device 1010 corresponding to a specified logical address) in accordance with some embodiments. In the method 1100, memory controller 1002 receives data to be written to memory device 1010 and an address associated with the data. In some implementations, the address received by the controller 1002 is a logical address, as the host device, not shown, has no direct knowledge of the physical memory addresses corresponding to the logical addresses. Alternatively, or from another viewpoint, the address received by the controller 1002 is a physical address with respect to controller 1002 but a logical address with respect to memory device 1010: the row and/or column portions of the address will be translated to provide the physical address in memory array 1009 to which the data will be written. It is noted that in some implementations the logical address is received in two commands, with a row portion of the logical address typically received in a first command and a column portion of the logical address received in a second command.

The row portion of the logical address is translated (1102) using the row translation table 1018. For example, memory controller 1002 (or alternately the device 1010) accesses the row translation table 1018 (e.g., table 800, FIGS. 8A-8C) and retrieves the physical address of a row 702 as stored in the entry 822 indexed by the row portion of the logical address. A row activation operation is performed (1106) using the physical row address from the row translation table to activate the row to which the data will be written.

The column portion of the logical address is translated (1108) using the column translation table 1020. For example, memory controller 1002 (or alternately the device 1010) accesses the column translation table 1020 (e.g., table 900, FIGS. 9A-9C) and retrieves the physical address of a column 706 as stored in the entry 702 indexed by the column portion of the logical address. In some implementations, row translation (1102) but not column translation (1108) is performed, while in some other implementations column translation (1108) but not row translation (1102) is performed. In yet other implementations, both are performed.

The data received from memory controller 1002 is buffered (1104) and provided to the array 1009. A column access operation is performed (1110) using the physical column address from the column translation table, and the data is written to resistive change memory cells at the intersection of the columns having the physical column address and the activated row.

By using row and column translation, the method 1100 enables a write operation to be performed in a memory device 1010 in which rows and/or groups of columns are subject to occasional swapping with spare rows and/or spare groups of columns, respectively, to improve device future endurance without the need to inform the memory controller of the swaps. While the method 1100 includes a number of operations that appear to occur in a specific order, it should be apparent that the method 1100 can include more or fewer operations. Operations can be executed serially or in parallel, an order of two or more operations may be changed, and/or two or more operations may be combined into a single operation. For example, the row translation operation 1102 is omitted in systems that only perform column swapping, and the column translation operation 1108 is omitted in systems that only perform row swapping.

Figure 11B:
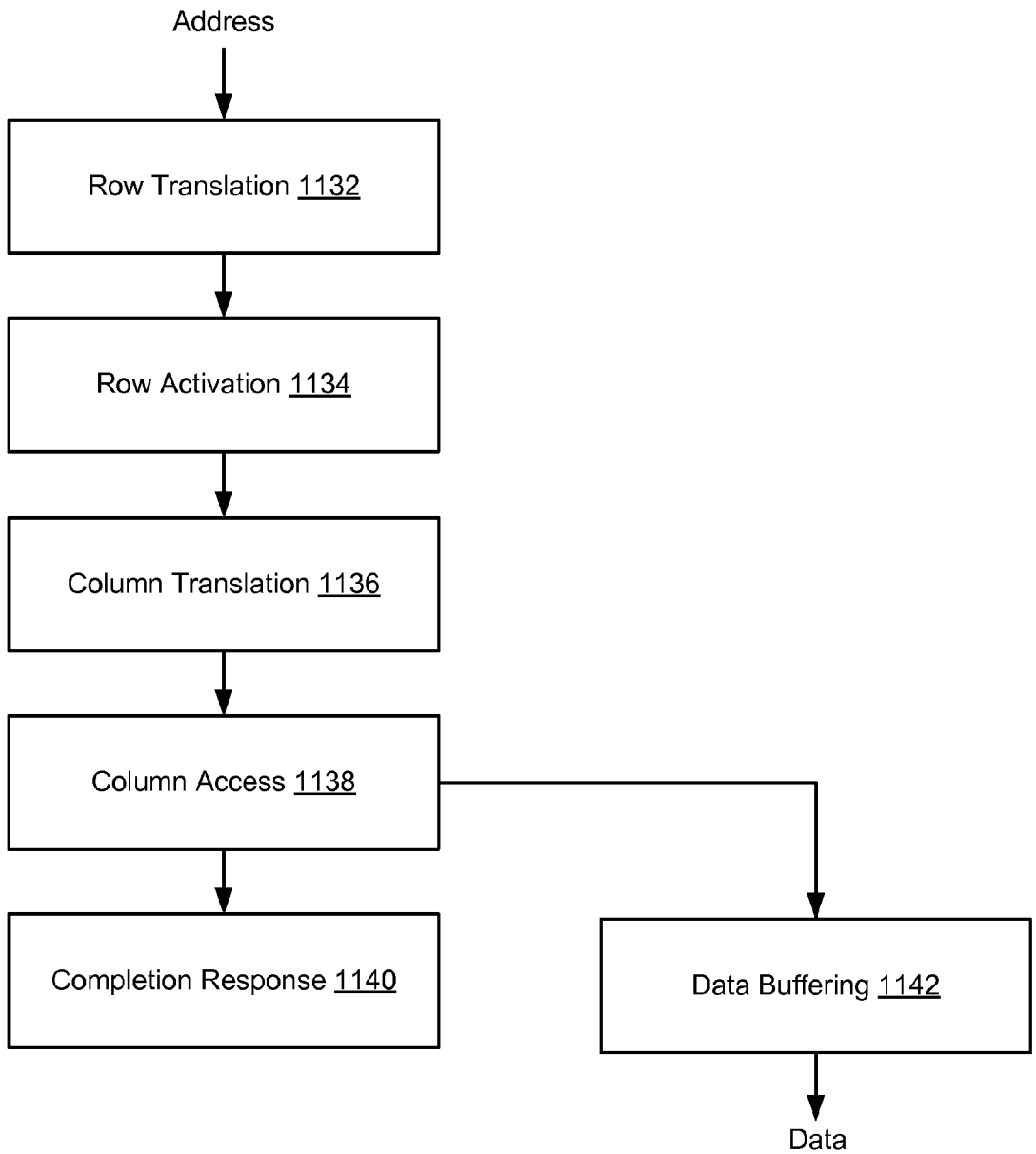

FIG. 11B is a flow diagram illustrating a method 1130 of performing a read operation in a memory device 1010 in accordance with some embodiments. In the method 1130, memory controller 1002 receives an address associated with data to be read from the memory device 1010. In some implementations, the address received by the controller 1002 is a logical address, as the host device, not shown, has no direct knowledge of the physical memory addresses corresponding to the logical addresses. Alternatively, or from another viewpoint, the address received by the controller 1002 is a physical address with respect to memory controller 1002 but a logical address with respect to memory device 1010: the row and/or column portions of the address will be translated to provide the physical address in the memory array 1009 from which the data will be read.

The row portion of the received logical address is translated (1132) using the row translation table 1018, as described for the row translation operation 1102 in method 1100 (FIG. 11A). A row activation operation is performed (1134) using the translated row address, to activate the row from which the data will be read.

The column portion of the received logical address is translated (1136) using the column translation table 1020, as described for the column translation operation 1108 in method 1100 (FIG. 11A). A column access operation is performed (1138) using the translated column address, and the data is read from the resistive change memory cells that are at the intersection of the columns having the translated column address and the activated row. The data is buffered (1142) and then provided as the output of method 1130. The controller 1002 posts a completion response (1140).

By using row and column translation, method 1130 performs a read operation in a memory device 1010 in which rows and groups of columns are swapped with spare rows and spare groups of columns to improve device future endurance. While the method 1130 includes a number of operations that appear to occur in a specific order, it should be apparent that method 1130 can include more or fewer operations. Operations can be executed serially or in parallel, an order of two or more operations may be changed, and/or two or more operations may be combined into a single operation. For example, the row translation operation 1132 is omitted in systems that only perform column swapping, and the column translation operation 1136 is omitted in systems that only perform row swapping.

Figure 12A:
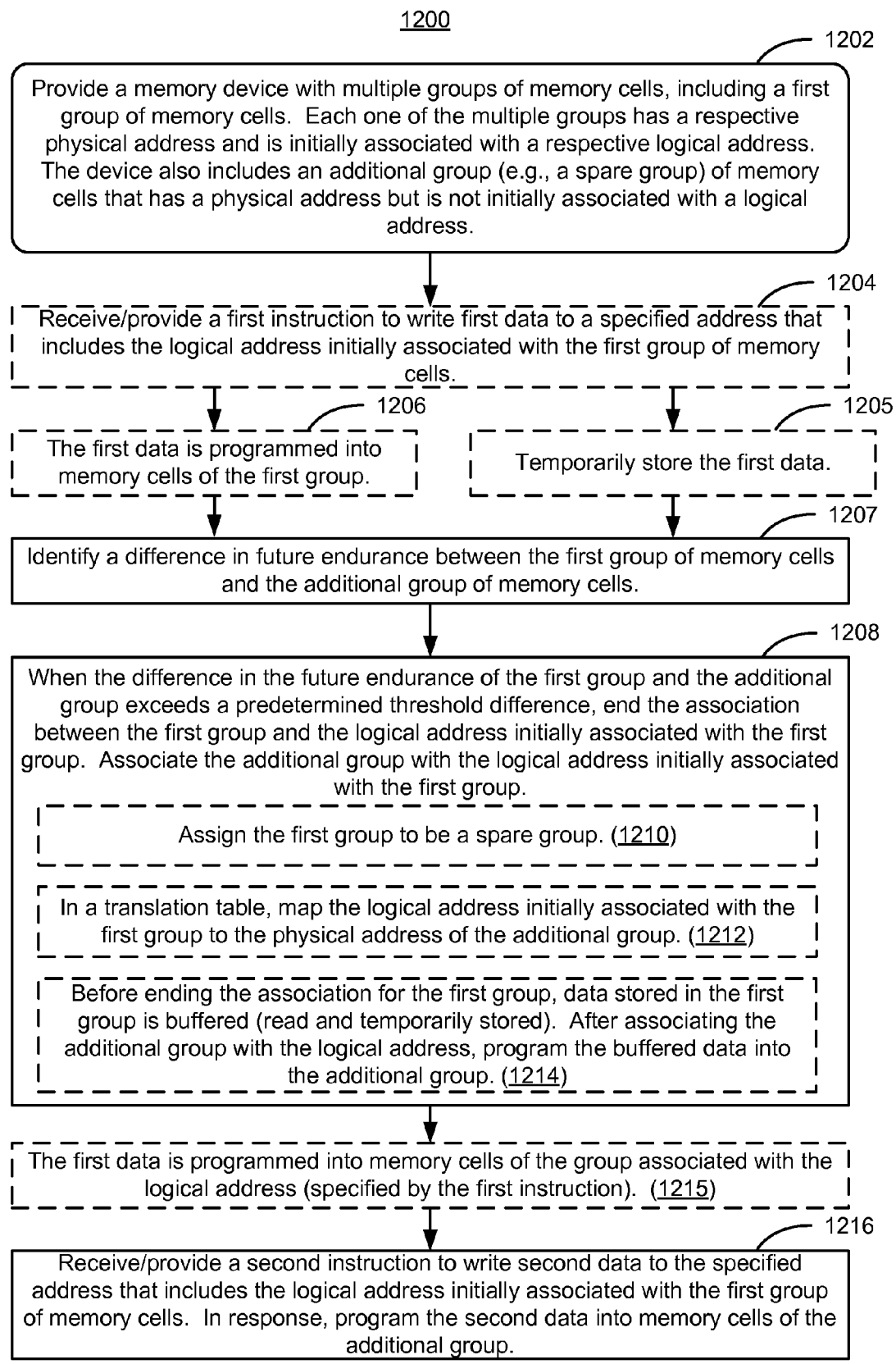
FIGS. 12A and 12B are flow diagrams illustrating methods of operating or controlling a memory device in accordance with some embodiments.

FIG. 12A is a flow diagram illustrating a method 1200 of operating or controlling a memory device in accordance with some embodiments. In the method 1200, a memory device (e.g., device 1010, FIG. 10) is provided (1202). The memory device includes groups of memory cells (e.g., resistive change memory cells 200, 220, 230, or 240, FIGS. 2A-2D), including a first group of memory cells. Each one of the groups has a respective physical address and is initially associated with a respective logical address. The device also includes an additional group (e.g., a spare group) of memory cells that has a physical address but is not initially associated with a logical address. The logical addresses are logical addresses with respect to the memory device, but may be considered physical addresses with respect to a corresponding memory controller (e.g., controller 1002, FIG. 10). In some embodiments, the memory cells of the memory device (e.g., the memory cells in the first group of memory cells, the memory cells in the additional group of memory cells, etc.) are resistive change memory cells.

In some embodiments, the physical and logical addresses include row addresses, and the groups of memory cells are respective rows of memory cells (e.g., rows 702-1 through 702-R, FIGS. 7A-7B). The first group is a first row (e.g., one of rows 702-1 through 702-R, FIGS. 7A-7B) and the additional group is an additional row (e.g., spare row 703, FIGS. 7A-7B).

In some embodiments, the physical and logical addresses include column addresses, and the groups of memory cells are respective groups of columns of memory cells (e.g., columns 706-1 through 706-C, FIGS. 7A-7B), or memory cells in respective groups of columns in a given row. The first group is a first group of columns (e.g., one of column groups 706-1 through 706-C, FIGS. 7A-7B) and the additional group is an additional group of columns (e.g., spare group of columns 707).

In some embodiments, the following operations 1204-1216 of method 1200 are performed in the memory device. Alternatively, the operations 1204-1216 are performed in a memory controller (e.g., controller 1002, FIG. 10) coupled to the device.

Optionally, a first instruction (e.g., a write data command) is received or provided (1204) to write first data to a specified address that includes the logical address initially associated with the first group of memory cells. In some implementations, in response to the first instruction, the first data is temporarily stored (1205), e.g., in a register, and the future endurance of the first group of memory cells is checked (1207, 1208), as described below, possibly resulting in a change in the group of memory cells associated with the address specified by the first instruction. Then the first data is programmed into the group of memory cells currently associated with the logical address specified by the first instruction (1215).

In some other implementations, in response to the first instruction, the first data is programmed into the first group of memory cells (1206) (e.g., in accordance with the method 1100, FIG. 11A). In these implementations, if the future endurance check (1207, 1208) results in a change in the group of memory cells associated with the address specified by the first instruction, data programmed into the first group of memory cells in operation 1206 is buffered (read and temporarily stored) and then buffered data is programmed into the new group of memory cells (called the "additional group" in the description below) associated with the specified address (1214). In yet some other implementations, the group of memory cells associated with the specified address already stores data previously written to the specified address, in which case operations 1204, 1205 and 1215 (or operations 1204, 1206 and 1214) are not performed.

A difference in the future endurance between the first group of memory cells and the additional group of memory cells is identified (1207). In some embodiments, operation 1207 is performed using a comparison circuit, such as current comparator circuit 600, shown in FIG. 6. In some other embodiments, identifying operation is performed by individually measuring the future endurances, or metrics corresponding to the future endurances, of the first group and additional group of memory cells, and determining a difference between the two. Method 1230 (FIG. 12B), described below, illustrates an example of the identifying operation 1207. As noted above, in some implementations operations 1207 and 1208 are performed in response to a first instruction to write data to a specified logical address. In some other implementations, operations 1207 and 1208 are performed in response to a command from a host device or memory controller, such as an integrity check command or refresh command, which prompts the memory device to check the future endurance of next address in a sequence of addresses.

In some embodiments, the memory cells include resistive change memory cells and identifying (1207) the difference in the future endurance between the first group and the additional group includes determining that the resistances in the reset state of resistive change memory cells of the first group and the resistances in the reset state of resistive change memory cells of the additional group differ by at least a predetermined threshold difference. In some implementations, determining that the resistances in the reset state of resistive change memory cells of the first group and the resistances in the reset state of resistive change memory cells of the additional group differ by at least the predetermined threshold difference includes detecting that read currents in the reset state of the resistive change memory cells of the first group and read currents in the reset state of the resistive change memory cells of the additional group differ by at least the predetermined threshold difference.

In some embodiments, the memory cells include resistive change memory cells and identifying (1207) the difference includes determining that resistances in a set state of resistive change memory cells of the first group and resistances in the set state of resistive change memory cells of the additional group differ by at least a predetermined threshold difference. In some implementations, determining that the resistance in the set state of resistive change memory cells of the first group and the resistance in the set state of resistive change memory cells of the additional group differ by at least the predetermined threshold difference includes detecting that read currents in the set state of the resistive change memory cells of the first group and read currents in the set state of the resistive change memory cells of the additional group differ by at least the predetermined threshold difference.

When the difference in the future endurance of the first group and the additional group exceeds a predetermined threshold difference, the association is ended (1208) between the first group and the logical address initially associated with the first group. Furthermore, an association is formed between the additional group and the logical address initially associated with the first group, after which the additional group is associated with the logical address initially associated with the first group.

In some embodiments, the additional group was a spare group (e.g., spare row 703 or spare group of columns 707, FIGS. 7A-7B) prior to operation 1208, and the first group is assigned (1210) to be a spare group by operation 1208. For example, in FIG. 8B row 702-1 has been assigned as a spare row, and in FIG. 9B row 706-1 has been assigned as a spare group of columns.

In some embodiments, the logical address initially associated with the first group is mapped (1212) in a translation table to the physical address of the additional group. For example, a mapping for the logical address is updated in row translation table 800 or column translation table 900, as illustrated in FIGS. 8A-8B and 9A-9B.

In some embodiments, before ending the association for the first group, data stored in the first group is read and temporarily stored (1214). For example, the data is temporarily stored (buffered) in the memory device (e.g., in data latches 404, FIG. 4) as read data. Alternatively, the data is temporarily stored in the memory controller (e.g., controller 1002, FIG. 10) as read data. The temporarily stored data is herein called buffered data. After associating the additional group with the logical address, the buffered data is programmed into the additional group (e.g., using write drivers 408, FIG. 4). The data that was stored in the first group thus is transferred to the additional group as part of the process of swapping the first group with the additional group.

A second instruction is received or provided (1216) to write second data to the specified address that includes the logical address initially associated with the first group of memory cells. In response, the second data is programmed into memory cells of the additional group (e.g., in accordance with the method 1100, FIG. 11A). The second data is not programmed into memory cells of the first group, because operation 1208 swapped the first group and the additional group.

In some embodiments, operations 1207 and 1208 are performed during a refresh operation (e.g., as specified by refresh circuitry 1016, FIG. 10). The groups are respective rows; the first group is a first row (e.g., any of rows 702-1 through 702-R, FIGS. 7A-7B) and the additional group is an additional row (e.g., row 703, FIGS. 7A-7B). During the refresh operation, data stored in the first row is read and temporarily stored (e.g., in data latches 404, FIG. 4). Operations 1207 and 1208 are performed, after which the data is written to the additional row (e.g., using write drivers 408, FIG. 4). The temporarily stored data is herein called buffered data. If, however, the detected difference in future endurance between the first and additional rows is less than the threshold difference, the buffered data is written back to the first row.

In some embodiments, operations 1207 and 1208 are performed as part of a write operation. For example, the operations 1207 and 1208 are performed in response to a command to write data to the logical address that is initially associated with the first group of memory cells. After operation 1208, the data is written to the additional group of memory cells. If, however, the difference in the future endurance between the first group of memory cells and the additional group of memory cells does not exceed the predetermined threshold difference, operation 1208 is not performed and the data is written to the first group of memory cells, since no swapping has occurred. In some embodiments, memory controller 1002 instructs device 1010 to perform operations 1207 and 1208 prior to writing the data to the appropriate group of memory cells. Alternatively, read/write circuitry 1013 (FIG. 10) initiates the performance of operations 1207 and 1208.

In some embodiments, the groups of memory cells also include a second group of memory cells distinct from both the first group and the additional group. After performing operations 1207 and 1208, these two operations are repeated, but for the second group and first group, the latter of which is now a spare group. When the difference in future endurance between the second group and the first group exceeds the predetermined threshold difference in operation 1207, the association between the second group and the logical address initially associated with the second group is ended and the first group is associated with the logical address initially associated with the second group. The first and second groups thus are swapped and the second group becomes a spare group.

The method 1200 provides a wear leveling scheme to improve the overall future endurance of a memory device by swapping groups of memory cells. While the method 1200 includes a number of operations that appear to occur in a specific order, it should be apparent that the method 1200 can include more or fewer operations. Operations can be executed serially or in parallel, an order of two or more operations may be changed, and/or two or more operations may be combined into a single operation.

Figure 12B:
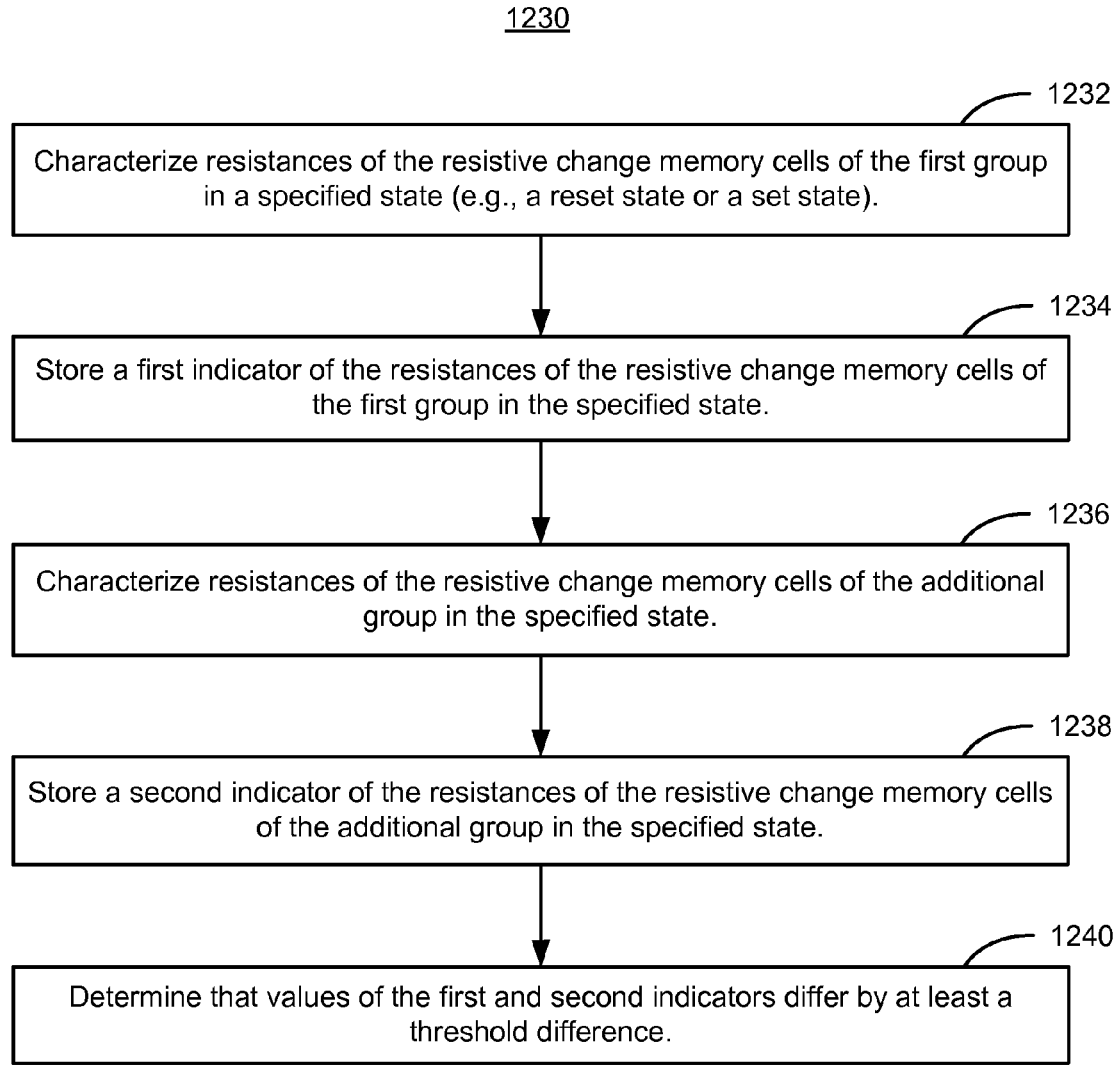

In some embodiments, memory cells of the memory device (e.g., the memory cells in the first group of memory cells, the memory cells in the additional group of memory cells, etc.) include resistive change memory cells. FIG. 12B is a flow diagram illustrating a method 1230 of identifying (1207, FIG. 12A) a difference in the future endurance of the first group of resistive change memory cells and the additional group of resistive change memory cells, in accordance with some embodiments. In the method 1230, resistances of the resistive change memory cells of the first group in a specified state (e.g., a reset state or a set state) are measured (1232). An indicator of the measured resistances of the resistive change memory cells of the first group in the specified state is stored (1234) (e.g., in result registers 1012, FIG. 10) as a first indicator.

Resistances of the resistive change memory cells of the additional group in the specified state are measured (1236). An indicator of the measured resistances of the resistive change memory cells of the additional group in the specified state is stored (1238) (e.g., in result registers 1012, FIG. 10) as a second indicator.

A determination is made (1240) that values of the first and second indicators differ by at least a threshold difference. Alternatively, a determination is made based on the first and second indicators that the future endurance of the resistive change memory cells in the first group is greater than the future endurance of the resistive change memory cells in the additional group by at least a threshold difference. In yet another alternative, a determination is made based on the first and second indicators that the future endurance of the resistive change memory cells in the first group is less than the future endurance of the resistive change memory cells in the additional group by at least a threshold difference. For example, future endurance comparator 1014 (FIG. 10) compares the first and second indicators as stored in result registers 1012 (FIG. 10). In some implementations, the first and second indicators are different when the characteristic resistances of the resistive change memory cells of the first group and the resistive change memory cells of the additional group fall within distinct (i.e., non-overlapping) predefined ranges of characteristic resistances.

In some embodiments, method 1230 is performed in resistive change memory device 1010 (FIG. 10). In some embodiments, controller 1002 (FIG. 10) performs operations 1234, 1238, and/or 1240 and provides instructions to resistive change memory device 1010 to perform characterization operations 1232 and 1236.

The method 1230 thus uses the results of future endurance measurement operations for respective groups of resistive change memory cells to identify whether the future endurance of a given group differs from that of the additional group by at least the predetermined threshold difference. While the method 1230 includes a number of operations that appear to occur in a specific order, it should be apparent that the method 1230 can include more or fewer operations. Operations can be executed serially or in parallel, an order of two or more operations may be changed, and/or two or more operations may be combined into a single operation.

In some embodiments, the method 1230 omits operations 1234 and 1238. In these embodiments, the method 1230 only includes operations 1232, 1236, and 1240. Accordingly, the first indicator and the second indicator are not stored.

As noted above, in some other embodiments, operation 1207 is performed using a direct comparison circuit, such as current comparator 600 shown in FIG. 6, to directly compare to metrics corresponding to the future endurance of two groups of memory cells without storing corresponding digital value prior to performing the comparison.

The foregoing description, for purpose of explanation, has been described with reference to specific embodiments. However, the illustrative discussions above are not intended to be exhaustive or to be limiting to the precise forms disclosed. Many modifications and variations are possible in view of the above teachings. The embodiments were chosen and described in order to best explain the principles disclosed and their practical applications, to thereby enable others to best utilize the disclosure and various embodiments with various modifications as are suited to the particular use contemplated.

What is claimed is:

1. A method of operating a memory device, the memory device comprising:
   groups of memory cells, the groups including a first group of memory cells, each one of the groups having a respective physical address and initially being associated with a respective logical address;
   an additional group of memory cells having a physical address but not initially being associated with a logical address; and
   a future endurance comparator to compare future endurances of the first group of memory cells and the additional group of memory cells, wherein the future endurance comparator comprises a circuit current comparator, the method comprising:
   identifying a difference in a future endurance between the first group of memory cells and the additional group of memory cells; and
   in accordance with a determination, made using the current comparator of the future endurance comparator, that the difference in the future endurance between the first group and the additional group exceeds a predetermined threshold difference:
       ending the association between the first group and the logical address initially associated with the first group; and
       associating the additional group with the logical address initially associated with the first group.

2. The method of claim 1, additionally comprising:
   prior to the identifying, receiving a first instruction to write first data to a specified address comprising the logical address initially associated with the first group of memory cells;
   in response to the first instruction, programming the first data into the memory cells of the first group corresponding to the logical address;
   after the associating and the ending of the association, receiving a second instruction to write second data to the specified address; and
   in response to the second instruction, programming the second data into the memory cells of the additional group corresponding to the logical address.

3. The method of claim 1, additionally comprising:
   prior to the identifying, receiving a first instruction to read first data from a specified address comprising the logical address initially associated with the first group of memory cells;
   in response to the first instruction, reading the first data from the memory cells of the first group corresponding to the logical address;
   after the associating and the ending of the association, receiving a second instruction to read second data from the specified address; and
   in response to the second instruction, reading data from the memory cells of the additional group corresponding to the logical address.

4. The method of claim 1, additionally comprising:
   in response to the identifying, buffering data stored in the first group; and
   after the associating, programming the buffered data into the additional group.

5. The method of claim 4, wherein the buffering comprises reading the data stored in the first group as read data, and storing the read data in the memory device.

6. The method of claim 1, wherein the associating comprises mapping the logical address initially associated with the first group to the physical address of the additional group.

7. The method of claim 6, wherein the mapping is performed in a translation table.

8. The method of claim 6, wherein ending the association comprises assigning the first group to be a spare group, wherein the additional group previously was assigned to be the spare group.

9. The method of claim 1, wherein the memory cells of the memory device include resistive change memory cells.

10. The method of claim 9, wherein the identifying comprises:
    determining that resistances in a reset state of resistive change memory cells of the first group differ from resistances in the reset state of the resistive change memory cells of the additional group by at least the predetermined threshold difference.

11. A memory device, comprising:
    groups of memory cells, including an unused group, each group having a respective physical address;
    a future endurance comparator to compare future endurances of the unused group and a specified group distinct from the unused group, wherein the future endurance comparator comprises a circuit current comparator; and
    a translation table to map respective logical addresses to the physical addresses of respective groups, wherein:
        the translation table does not map any logical address to the physical address of the unused group; and the translation table is programmable to replace the specified group with the unused group and to designate the specified group as unused, in response to detection by the current comparator of the future endurance comparator of a difference in the future endurance between the unused group and the specified group that exceeds a predetermined threshold difference.

12. The memory device of claim 11, wherein the memory cells of the memory device include resistive change memory cells, and wherein the future endurance comparator is configured to compare resistances of resistive change memory cells of the unused group to resistive change memory cells of the specified group.

13. The memory device of claim 11, wherein the translation table is programmable to replace the specified group with the unused group and to designate the specified group as unused by deleting a mapping between the specified group and a corresponding logical address and mapping the corresponding logical address to the unused group.

14. The memory device of claim 12, additionally comprising a register, coupled to the future endurance comparator, to store indicators of the resistances.

15. The memory device of claim 11, wherein the translation table is programmable to map a logical address to the physical address of any of the groups.

16. The memory device of claim 11, wherein:
the groups of memory cells comprise respective rows of memory cells, including an unused row, each row having a respective physical row address;
the circuit current comparator comprises circuitry to compare the circuit currents of the unused row and a specified row distinct from the unused row; and
the translation table comprises a row translation table to map respective logical row addresses to the physical row addresses of respective rows, wherein:
the translation table does not map any logical row address to the physical row address of the unused row;
the row translation table is programmable to replace the specified row with the unused row and to designate the specified row as unused, in response to detection by the future endurance comparator of a difference in the future endurance between the unused row and the specified row that exceeds the predetermined threshold difference.

17. The memory device of claim 16, additionally comprising:
latches to store data from the specified row; and
write drivers to program the data from the latches into the unused row.

18. The memory device of claim 16, additionally comprising a refresh control circuit coupled to the future endurance comparator and the row translation table.

19. The memory device of claim 18, wherein the refresh control circuit is configured to instruct the future endurance comparator to compare the future endurances during a refresh operation.

20. The memory device of claim 18, wherein the refresh control circuit is configured to instruct the row translation table to replace the specified row with the unused row and to designate the specified row as unused during a refresh operation.

21. A method of operating a memory device, the memory device comprising:
groups of memory cells, the groups including a first group of memory cells, each one of the groups having a respective physical address and initially being associated with a respective logical address; and
an additional group of memory cells having a physical address but not initially being associated with a logical address, the method comprising:
comparing a measured circuit current characteristic of the first group of memory cells and a measured circuit current characteristic of the additional group of memory cells to identify a difference in a future endurance between the first group of memory cells and the additional group of memory cells; and
in accordance with a determination that the difference in the future endurance between the first group and the additional group exceeds a predetermined threshold difference:
ending the association between the first group and the logical address initially associated with the first group; and
associating the additional group with the logical address initially associated with the first group.

* * * * *